(12) United States Patent
Gosavi et al.

(10) Patent No.: US 12,476,640 B2
(45) Date of Patent: Nov. 18, 2025

(54) PEROVSKITE-BASED MAGNETOELECTRIC SPIN-ORBIT LOGIC DEVICES

(71) Applicants: Tanay A. Gosavi, Portland, OR (US); Chia-Ching Lin, Portland, OR (US); Sasikanth Manipatruni, Portland, OR (US); Dmitri Evgenievich Nikonov, Beaverton, OR (US); Ian Alexander Young, Olympia, WA (US); Ramamoorthy Ramesh, Moraga, CA (US); Darrell G. Schlom, Ithaca, NY (US); Megan E. Holtz, Lakewood, CO (US); Rachel A. Steinhardt, Beaverton, OR (US)

(72) Inventors: Tanay A. Gosavi, Portland, OR (US); Chia-Ching Lin, Portland, OR (US); Sasikanth Manipatruni, Portland, OR (US); Dmitri Evgenievich Nikonov, Beaverton, OR (US); Ian Alexander Young, Olympia, WA (US); Ramamoorthy Ramesh, Moraga, CA (US); Darrell G. Schlom, Ithaca, NY (US); Megan E. Holtz, Lakewood, CO (US); Rachel A. Steinhardt, Beaverton, OR (US)

( * ) Notice: Subject to any disclaimer, the term of this patent is extended or adjusted under 35 U.S.C. 154(b) by 600 days.

(21) Appl. No.: 17/733,166

(22) Filed: Apr. 29, 2022

(65) Prior Publication Data
US 2023/0353157 A1 Nov. 2, 2023

(51) Int. Cl.
*H03K 19/18* (2006.01)
*H10B 61/00* (2023.01)
*H10N 50/80* (2023.01)
*H10N 50/85* (2023.01)

(52) U.S. Cl.
CPC ............. *H03K 19/18* (2013.01); *H10B 61/00* (2023.02); *H10N 50/80* (2023.02); *H10N 50/85* (2023.02)

(58) Field of Classification Search
CPC ........ H03K 19/18; H10B 61/00; H10N 50/80; H10N 50/85; H10N 50/01; H10N 50/20
See application file for complete search history.

(56) References Cited

U.S. PATENT DOCUMENTS

2019/0386662 A1* 12/2019 Lin ................... H01F 41/302
2020/0134419 A1* 4/2020 Manipatruni .......... H10N 50/80

OTHER PUBLICATIONS

Yin et al. ("A review on all-perovskite multiferroic tunnel junctions," J. Materiomics 3, 245-254, 2017) (Year: 2017).*

(Continued)

*Primary Examiner* — Yasser A Abdelaziz
(74) *Attorney, Agent, or Firm* — Alliance IP, LLC

(57) ABSTRACT

Magnetoelectric spin-orbit logic (MESO) devices comprise a magnetoelectric switch capacitor coupled to a spin-orbit coupling structure. The logic state of the MESO device is represented by the magnetization orientation of the ferromagnet of the magnetoelectric switch capacitor and the spin-orbit coupling structure converts the magnetization orientation of the ferromagnet to an output current. MESO devices in which all or at least some of the constituent layers of the device are perovskite materials can provide advantages such as improved control over the manufacturing of MESO devices and high quality interfaces between MESO layers due to the lattice matching of perovskite materials.

25 Claims, 16 Drawing Sheets

(56) References Cited

OTHER PUBLICATIONS

M. Holtz, et al., "A Room-Temperature Magnetoelectric Multiferroic made by Thin Film Alchemy," as presented at AVS 66th International Symposium and Exhibition, Oct. 21, 2019 (34 pgs).
R. Steinhardt, et al., "Breaking Symmetries to Create a Robust Room-Temperature Ferrimagnetic Ferroelectric in $LuFeO_3$/$CoFe_2O_4$ Superlattices," as presented at Materials Research Society Symposium EL03—Multiferroics and Magnetoelectrics, Dec. 3, 2019 (40 pgs).

* cited by examiner

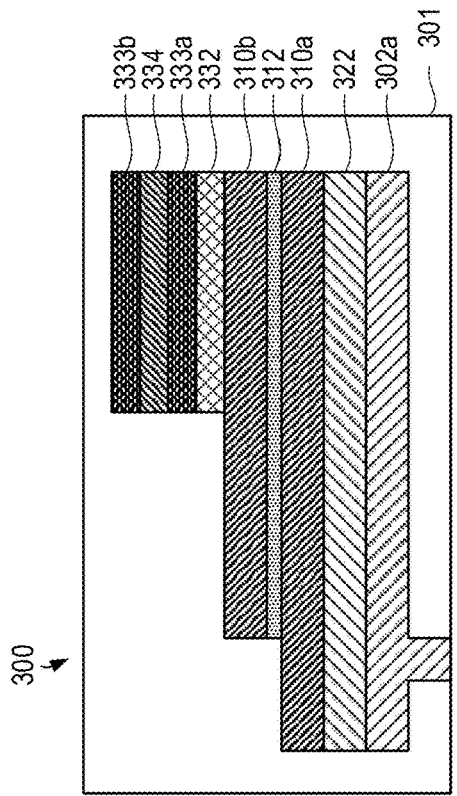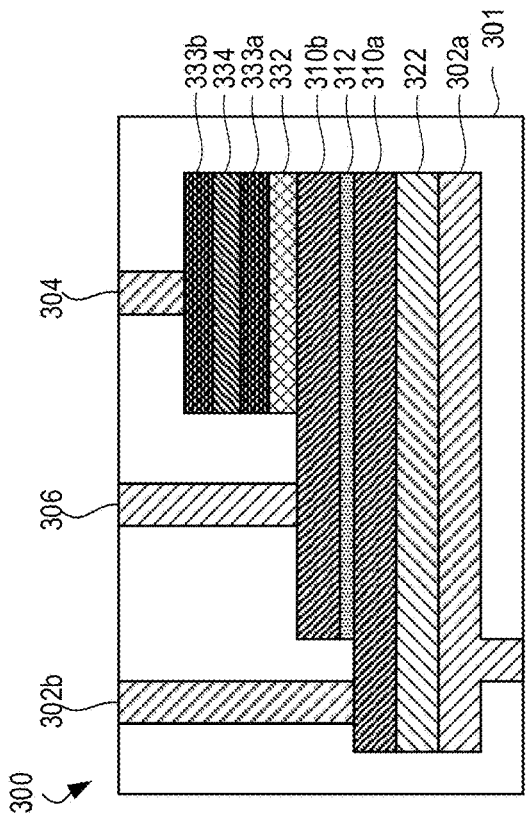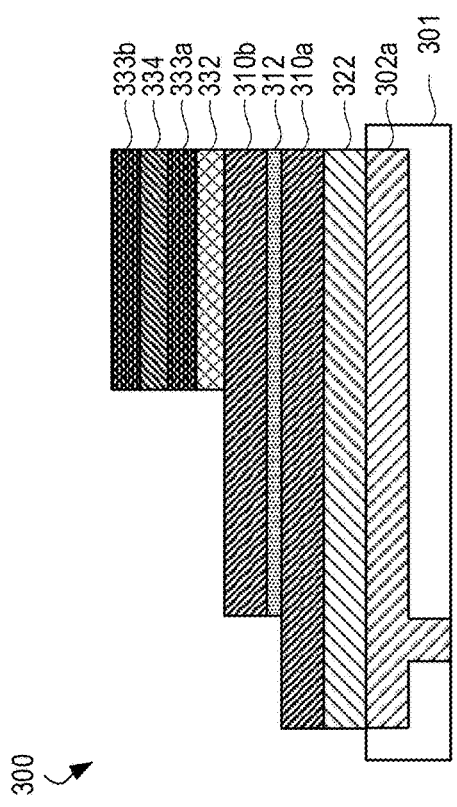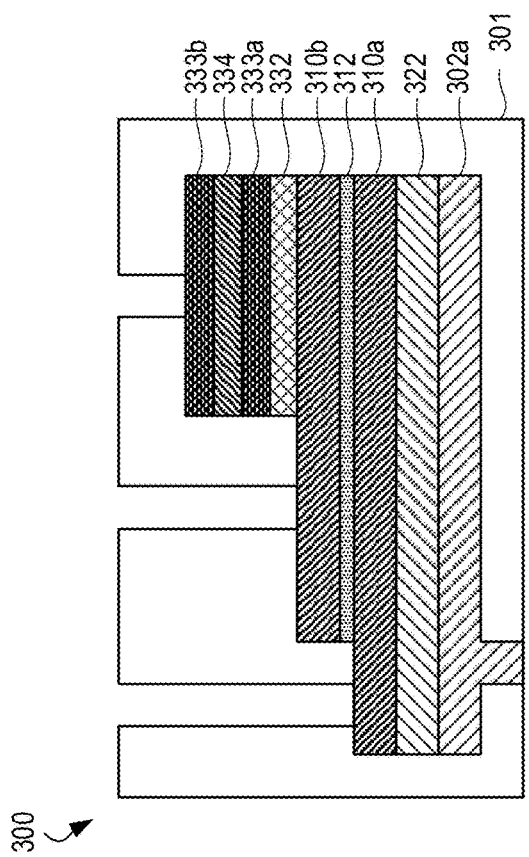
FIG. 3E
FIG. 3F
FIG. 3G
FIG. 3H

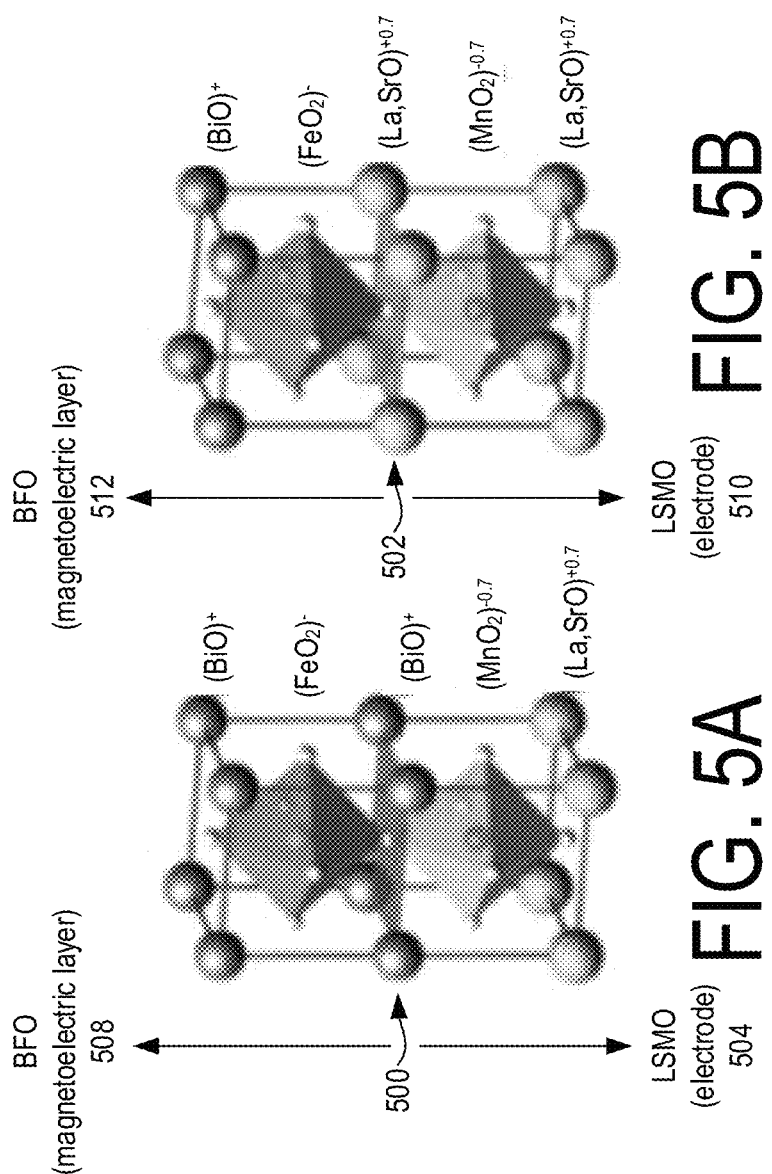

PEROVSKITE-BASED MAGNETOELECTRIC SPIN-ORBIT LOGIC DEVICES

BACKGROUND

Magnetoelectric spin-orbit (MESO) logic is a type of spintronic logic that operates using the magnetoelectric effect in conjunction with the spin-orbit coupling effect (e.g., the coupling of an electron's angular momentum with its linear momentum). For example, a MESO device uses magnetoelectric switching to convert an input voltage/charge into a magnetic spin state (e.g., charge-to-spin conversion) and further uses spin-orbit transduction to convert the magnetic spin state back into an output charge/voltage (e.g., spin-to-charge conversion).

Perovskite materials are a class of materials that have the general chemical formula of $ABX_3$ (comprising mostly of oxides (X=oxygen)). Perovskite materials have the same crystal structure and a similar lattice constant.

BRIEF DESCRIPTION OF THE DRAWINGS

FIGS. 3A-3H illustrate cross-sectional views of an example differential input MESO device at various stages of fabrication.

FIGS. 5A-5B illustrate example BFO/LSMO interfaces in a perovskite-based MESO device.

DETAILED DESCRIPTION

Figure 1B:
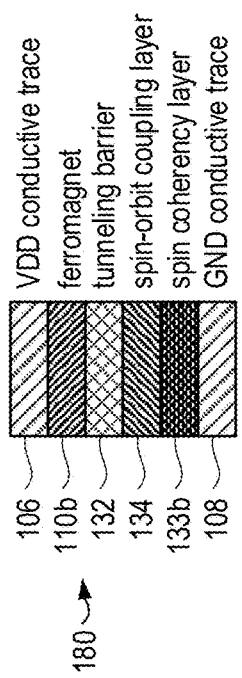
FIGS. 1B-1D illustrate example multi-layer structures that can be utilized in the spin-orbit coupling module of the MESO device illustrated in FIG. 1A.

Spintronic logic refers to a class of integrated circuit devices that utilize a physical variable of magnetization or spin as a computational variable. Moreover, the physical variable used in spintronic logic can be non-volatile, which means the computational state is preserved when power to the integrated circuit is switched off. As a result, spintronic logic is energy efficient and can enable ultralow power sleep states.

Magnetoelectric spin-orbit (MESO) logic refers to a class of spintronic logic that operates using the magnetoelectric effect in conjunction with the spin-orbit coupling effect (e.g., the coupling of an electron's angular momentum with its linear momentum). For example, a MESO device uses magnetoelectric switching to convert an input charge/voltage into a magnetic spin state (e.g., charge-to-spin conversion) and further uses spin-orbit transduction to convert the magnetic spin state back into an output charge/voltage (e.g., spin-to-charge conversion). In this manner, a MESO device can be used to implement a logic device (e.g., a logic switch/gate) with a non-volatile logical state. For example, a logical state represented by an input charge/voltage can be converted into a (non-volatile) magnetic spin state, and the logical state can subsequently be read out by converting the magnetic spin state back into an output charge/voltage.

Accordingly, MESO devices can be used to implement logic circuitry (e.g., logic switches/gates) for scalable integrated circuits, analogous to CMOS (complementary metal-oxide-semiconductor) transistors. Compared to CMOS technology, however, MESO logic has superior energy efficiency (e.g., lower energy consumption for switching, lower operating voltage), higher integration density and efficiency (e.g., more logic functions per unit area, fewer devices required per logic function), and non-volatility (e.g., which counteracts leakage power and enables ultralow standby power).

Disclosed herein are MESO logic devices made of perovskite materials. Perovskites are used for the MESO magnetoelectric layer, ferromagnet, tunneling barrier, spin coherent layers, spin-orbit coupling layer, and conductive traces that act as electrodes for a MESO device. Perovskite materials belong to a class of materials that have the same crystal structure and a similar lattice constant. The fabrication of MESO devices comprising layers having the same crystal structure and similar lattice constant can allow for tight control over layer growth during device fabrication and the fabrication of high quality interfaces between layers (e.g., interfaces that have fewer defects, such as trap interface charges and Schottky barriers).

In the following description, specific details are set forth, but embodiments of the technologies described herein may be practiced without these specific details. Well-known circuits, structures, and techniques have not been shown in detail to avoid obscuring an understanding of this description. Phrases such as "an embodiment," "various embodiments," "some embodiments," and the like may include features, structures, or characteristics, but not every embodiment necessarily includes the particular features, structures, or characteristics.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner. "Connected" may indicate elements are in direct physical or electrical contact with each other and "coupled" may indicate elements co-operate or interact with each other, but they may or may not be in direct physical or electrical contact. Furthermore, the terms "comprising,"

"including," "having," and the like, as used with respect to embodiments of the present disclosure, are synonymous. The terms "substantially," "close," "approximately," "near," and "about" may refer to being within +/−10% of a target value unless otherwise specified. Similarly, terms describing spatial relationships, such as "perpendicular," "orthogonal," or "coplanar," may refer to being substantially within the described spatial relationships (e.g., within +/−10 degrees of orthogonality).

As used herein, the phrase "located on" in the context of a first layer or component located on a second layer or component refers to the first layer or component being directly physically attached to the second part or component (no layers or components between the first and second layers or components) or physically attached to the second layer or component with one or more intervening layers or components.

As used herein, the term "between" in reference to the position of a layer or component relative to two other layers or components can refer to the layer or component being positioned adjacent to the two other layers or components or one or more intervening layers or components being positioned between the layer or component and either one (or both) of the other layers or components.

As used herein, the term "adjacent" refers to layers or components that are in physical contact with each other. That is, there is no layer or component between the stated adjacent layers or components. For example, a layer X that is adjacent to a layer Y refers to a layer that is in physical contact with layer Y.

Certain terminology may also be used in the following description for the purpose of reference only, and thus are not intended to be limiting. For example, terms such as "upper," "lower," "above," "below," "bottom," and "top" refer to directions in the drawings to which reference is made. Terms such as "front," "back," "rear," and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As used herein, the term "integrated circuit component" refers to a packaged or unpacked integrated circuit product. A packaged integrated circuit component comprises one or more integrated circuit dies mounted on a package substrate with the integrated circuit dies and package substrate encapsulated in a casing material, such as a metal, plastic, glass, or ceramic. In one example, a packaged integrated circuit component contains one or more processor units mounted on a substrate with an exterior surface of the substrate comprising a solder ball grid array (BGA). In one example of an unpackaged integrated circuit component, a single monolithic integrated circuit die comprises solder bumps attached to contacts on the die. The solder bumps allow the die to be directly attached to a printed circuit board. An integrated circuit component can comprise one or more of any computing system component described or referenced herein or any other computing system component, such as a processor unit (e.g., system-on-a-chip (SoC), processor core, graphics processor unit (GPU), accelerator, chipset processor), I/O controller, memory, or network interface controller. An integrated circuit component can comprise one or more MESO devices and MESO devices can be utilized in processor units, memories, or any other component within an integrated circuit component.

Reference is now made to the drawings, which are not necessarily drawn to scale, wherein similar or same numbers may be used to designate the same or similar parts in different figures. The use of similar or same numbers in different figures does not mean all figures including similar or same numbers constitute a single or same embodiment. Like numerals having different letter suffixes may represent different instances of similar components. The drawings illustrate generally, by way of example, but not by way of limitation, various embodiments discussed in the present document.

Figure 1C:
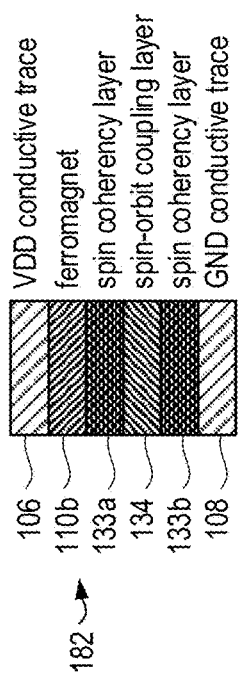
Figure 1D:
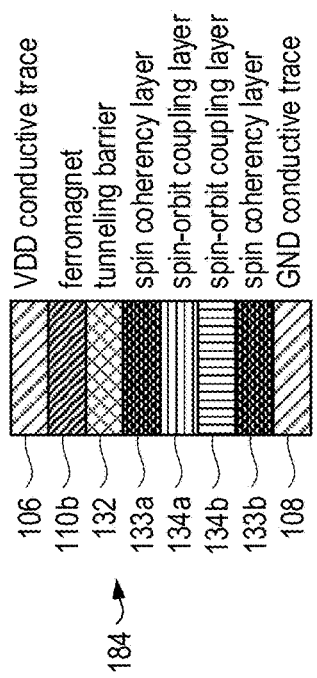
Figure 1A:
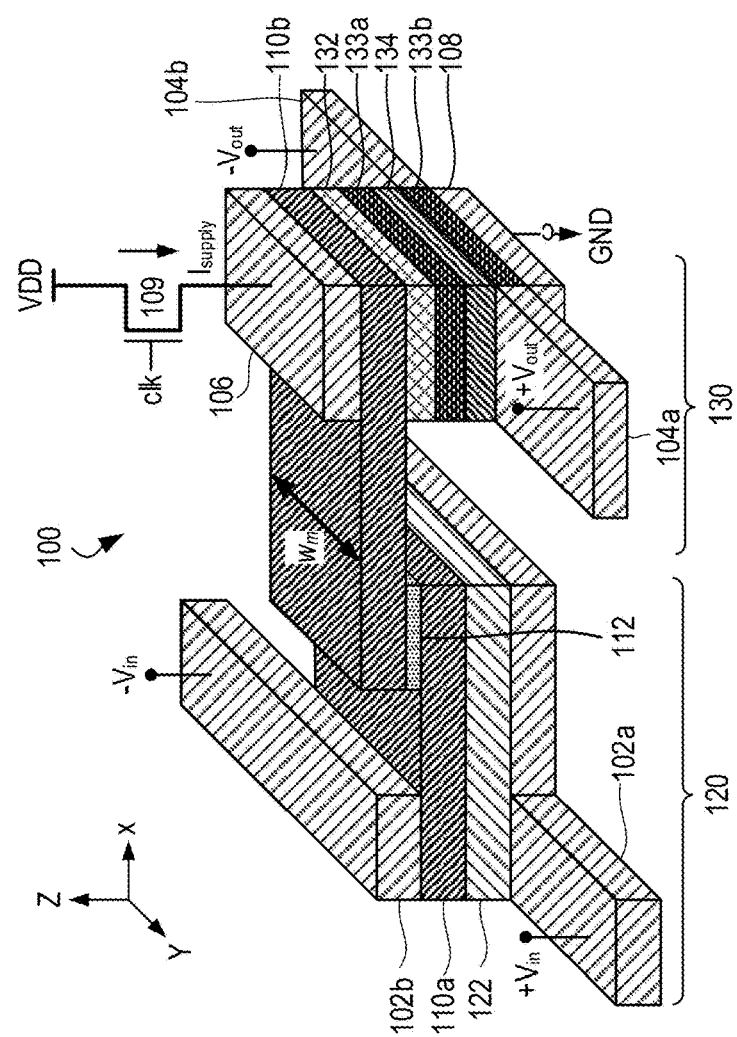
FIG. 1A illustrates an example differential magnetoelectric spin-orbit (MESO) logic device.

In the following description, for purposes of explanation, numerous specific details are set forth in order to provide a thorough understanding thereof. It may be evident, however, that the novel embodiments can be practiced without these specific details. In other instances, well known structures and devices are shown in block diagram form in order to facilitate a description thereof. The intention is to cover all modifications, equivalents, and alternatives within the scope of the claims FIG. 1A illustrates an example differential magnetoelectric spin-orbit (MESO) logic device. MESO device 100 is a differential MESO device that can be used to implement a single MESO logic gate. FIGS. 1B-1D illustrate example multi-layer structures that can be utilized in the spin-orbit coupling module of the MESO device illustrated in FIG. 1A.

In the illustrated embodiments, MESO device 100 includes a ferromagnet 110, a magnetoelectric (ME) conversion module 120, and a spin-orbit conversion structure 130. MESO device 100 also includes conductive traces (interconnects), portions of which serve as electrodes, to provide differential voltage inputs (+/−$V_{in}$), a power supply ($V_{DD}$), and ground (GND) 108, and carry differential voltage outputs (+/−$V_{out}$). For example, conductive traces 102a-b provide differential input voltages (+/−$V_{in}$), conductive traces 104a-b carry differential output voltage signals (+/−$V_{out}$), conductive trace 106 provides power ($V_{DD}$), and conductive trace 108 provides ground (GND) to the device 100. In other embodiments, the differential input and output voltage terminals (+/−$V_{in}$ and +/−$V_{out}$) may be replaced with a single input voltage terminal ($V_{in}$) and a single output voltage terminal ($V_{out}$), respectively (e.g., with a conductive trace coupling the input voltage terminal ($V_{in}$) to the magnetoelectric layer 122, and a conductive trace coupling the spin-orbit coupling layer 134 to the output voltage terminal ($V_{out}$)).

The magnetoelectric module 120 performs charge-to-spin conversion to convert an electric charge current into spin (e.g., inducing a particular direction of magnetization on the ferromagnet 110), and the SO structure 130 performs spin-to-charge conversion to convert spin (e.g., the direction of magnetization induced on the ferromagnet 110) back into an electric charge current, as described further below.

In the illustrated embodiment, the ferromagnet 110 is formed by two ferromagnets 110a-b coupled via an intermagnet insulating layer 112, which collectively function as a single ferromagnet 110. That is, when the magnetization changes on one of the ferromagnets 110a-b, the magnetization orientation on the other ferromagnet changes. Moreover, ferromagnets 110a-b comprise a ferromagnetic material that retains the magnetization setting induced on it, which is to say that it is non-volatile.

The magnetoelectric module 120 includes a structure (e.g., stack of layers) configured to convert an electric charge current into spin (e.g., magnetization). For example, the magnetoelectric module 120 is formed by the positive input voltage (+$V_{in}$) conductive trace 102a, which in turn is coupled to a magnetoelectric layer 122, which in turn is coupled to ferromagnet 110a, which in turn is coupled to the negative input voltage ($-V_{in}$) interconnect 102b. The magnetoelectric layer 122 has both ferroelectric properties (e.g., can be electrically polarized with or without an applied electric field) and magnetic properties (e.g., may exhibit surface spin polarization which can be switched under the application of an external electric field). In this manner, the magnetoelectric module 120 is configured as a capacitor, with ferromagnet 110 and input voltage interconnect 102a serving as electrical plates surrounding the magnetoelectric layer 122.

When voltage is applied via the differential voltage inputs (+/−V), charge current ($I_{in}$) flows across the magnetoelectric layer 122, which results in ferroelectric polarization in the magnetoelectric layer 122 and forms an electric field in the +/−Z direction depending on the polarity of the current ($I_{in}$). For example, when a positive input differential voltage ($V_{in}$) is applied, the current flow is positive and an electric field forms in the +Z direction, with a positive charge adjacent to positive voltage ($+V_{in}$) conductive trace 102a and a negative charge ($-V_{in}$) adjacent to ferromagnet 110a. By contrast, when a negative input differential voltage ($V_{in}$) is applied, the current flow is negative and an electric field forms in the −Z direction, with a negative charge adjacent positive voltage ($+V_{in}$) conductive trace 102a and a positive charge adjacent to ferromagnet 110a ($-V_{in}$).

As the charge accumulates in the magnetoelectric module 120, the spin of electrons in the magnetoelectric layer 122 at the interface with ferromagnet 110a becomes aligned to form surface spin polarization, forming a magnetic field. The orientation of magnetization (spin) of the electrons in the surface spin polarization is defined by the orientation of ferroelectric polarization within the magnetoelectric layer 122. As the magnetic field corresponding to the surface spin polarization is formed, it becomes exchange coupled with ferromagnet 110a, causing the magnetization in ferromagnet 110a to align with the magnetic field of the surface spin polarization, which in turn causes the same effect to occur in ferromagnet 110b. In this manner, the orientation of magnetization of the ferromagnet 110 can be switched based on the input current ($I_{in}$). This setting of the orientation of magnetization of the ferromagnet 110 affects the output of the SO structure 130, as described below.

The SO structure 130 is configured to convert spin (e.g., the magnetization) back into an electric charge current. For example, with reference to FIG. 1A, the spin-orbit (SO) structure 130 includes a power supply ($V_{DD}$) conductive trace 106 coupled to ferromagnet 110b, which in turn is coupled to a tunneling barrier 132. Tunneling barrier 132 is coupled to a first spin coherent layer 133a, which in turn is coupled to spin-orbit coupling layer 134, which in turn is coupled to a second spin coherent layer 133b. Ground conductive trace 108 is coupled to the second spin coherent layer 133b. Moreover, in some embodiments, the supply of power to the ferromagnet 110b is controlled via a transistor 109 that has its gate terminal connected to a clock signal or other control signal.

When voltage is applied via the power supply ($V_{DD}$) conductive trace 106 (e.g., 100 mV), a supply charge current ($I_{supply}$) flows through ferromagnet 110b. The magnetization of the ferromagnet 110b produces a spin polarized current in which a substantial majority (e.g., greater than 80%) of electrons associated with the supply charge current ($I_{supply}$) will exhibit spin (e.g., magnetization) having an orientation corresponding to the magnetization of ferromagnet 110b. The strength of the spin polarized current (e.g., the proportion of electrons that align with ferromagnet 110b) is proportional to the strength of the magnetization.

After the supply current passes through ferromagnet 110b and becomes a spin polarized current, the spin polarized current enters the tunneling barrier 132, which serves as a tunneling barrier to the spin-orbit coupling layer 134. For example, because the ferromagnet 110b has low resistance and the spin-orbit coupling layer 134 has high resistance, if those components are adjacent to each other, spin current can flow from the spin-orbit coupling layer 134 back into the ferromagnet 110b. As a result, the tunneling barrier 132 is placed between the ferromagnet 110b and the spin-orbit coupling layer 134, which serves as a tunneling barrier to prevent spin flow from the spin-orbit coupling layer 134 back into the ferromagnet 110b. In this manner, the spin polarized current flows from ferromagnet 110b through the tunneling barrier 132 and into the spin-orbit coupling layer 134, with a small amount or no spin flow in the opposite direction. The spin coherent layer 133a can further improve the spin polarization of electrons injected into the spin-orbit coupling layer 134. The thickness of the spin coherent layer 133a is less than $\lambda_{sf}$, the length of relaxation of spin polarization.

The spin-orbit coupling layer 134 has a strong or high spin-orbit effect, which is referred to as spin-orbit coupling. As a result, when the spin polarized current flows through the spin-orbit coupling layer 134, due to the inverse spin-orbit coupling effect, the spin current converts into charge current ($I_{out}$), which produces an output voltage on the differential output conductive traces ($+/-V_{out}$) 104a and 104b. A spin coherent layer 133b is coupled to the spin-orbit coupling layer 134 and the output conductive traces 104a-b.

This phenomenon is referred to as the inverse spin Hall effect (SHE), where a spin current transforms into a charge current when the spin current flows through a material with high spin-orbit interaction. By contrast, the standard spin Hall effect is a phenomenon where a charge current transforms into a spin current when the charge current flows through a material with high spin-orbit interaction. The directions of the spins are opposite at opposing lateral boundaries of the material, and the spin polarization is proportional to the current and changes sign when the direction of the current is reversed. Thus, the inverse spin Hall effect is simply the reverse of the spin Hall effect.

In the illustrated example, the spin-orbit structure 130 is configured so that the direction of deflection of the electrons due to the spin Hall effect is either into or away from the differential voltage output conductive traces ($+/-V_{out}$) 104a-b, which serve as an output of the MESO device 100. More particularly, the deflection of electrons produced by the spin Hall effect is along an axis (e.g., the Y-axis) substantially perpendicular to both the supply charge current ($I_{supply}$) (e.g., the Z-axis) and the spin polarized current corresponding to the orientation of magnetization (e.g., the X-axis), the two of which are substantially perpendicular to each other. Thus, the differential voltage outputs ($+/-V_{out}$) 104a-b are positioned substantially perpendicular to ferromagnet 110b (and associated orientation of magnetization) and substantially perpendicular to the direction of the supply charge current ($I_{supply}$). Thus, the spin-orbit coupling layer 134 deflects a majority of electrons into or away from the voltage outputs ($+/-V_{out}$) 104a-b, thereby resulting in an output current ($I_{out}$) that is proportional to the supply charge current ($I_{supply}$). In this manner, an output voltage is produced on the differential voltage output conductive traces ($+/-V_{out}$) 104a-b, which serves as an output of the MESO device 100. A residual current may also pass through the spin-orbit coupling layer 134 to ground conductive trace 108.

In the illustrated example, the input voltage differential $(+/-V_{in})$ and the supply charge current $(I_{supply})$ may be provided during separate operations implemented at different times. More particularly, providing the input voltage differential may be compared to a write operation that sets or adjusts the orientation of magnetization of the ferromagnet 110. Further, providing the supply charge current $(I_{supply})$ may be compared to a read operation that produces the output voltage differential $(+/-V_{out})$, which is proportional to the magnetization of the ferromagnet 110 previously established during the write operation associated with the input current $(V_{in})$.

In some embodiments, the value of the magnetization may be binary in which the ferromagnet 110 is switched between one of two stable states. In such examples, the value of the magnetization is equal in both states but has an opposite sign (e.g., +1 in the first orientation and −1 in the second orientation). Thus, the corresponding output current $(I_{out})$ is proportional to the supply current $(I_{supply})$ except that the sign or polarity may be changed.

In some embodiments, intermediate values for the magnetization may be achieved by controlling the position of a domain wall dividing distinct magnetic domains within the ferromagnet 110 of the MESO device 100. Thus, in some examples, the magnetization of the ferromagnet 110 may be controlled to a range of different values. The range may correspond to a plurality of discrete values or it may be substantially continuous between the steady states +1 and −1 described above.

As noted above, the respective voltages produced on the differential voltage output conductive traces $(+/-V_{out})$ 104a-b serve as an output of the MESO device 100. However, logic chains are typically implemented as a collection of cascaded logic devices, where the output of one device serves as the input to another device. As a result, the output signals $(+/-V_{out})$ of the MESO device 100 must be large enough to drive the input signals $(+/-V_{in})$ 102a-b of another MESO device.

The MESO device of FIG. 1A is a perovskite-based MESO device in that perovskite materials are used for the conductive traces 102a-b, 104a-b, 106, and 108, the magnetoelectric layer 122, the ferromagnets 110a-b, the inter-magnet insulating layer 112, the tunneling barrier 132, the spin coherent layers 133a-b, and the spin-orbit coupling layer 134.

MESO conductive traces carrying or providing input signals, output signals, power, and ground (e.g., 102a-b, 104a-b, 106, and 108), and interconnects connecting to these conductive traces can comprise suitable perovskite materials, such as those comprising lanthanum (La), strontium (Sr), manganese (Mn), oxygen (O), niobium (Nb), and/or ruthenium (Ru), such as lanthanum strontium oxide ($La_{(1-x)}Sr_{(x)}MnO_3$ (LSMO)), niobium-doped strontium titanate (Nb—$SrTiO_3$ (Nb-STO)), and/or $SrRuO_3$ (SRO).

The ferromagnets 110a-b can comprise suitable perovskite materials, such as those comprising lanthanum, strontium, molybdenum (Mo), iron (Fe), and/or oxygen, such as LSMO and $La_{(1-x)}Sr_{(x)}Fe_{(1-y)}Mo_{(y)}O_3$ (LSFMO) (e.g., $La_{0.9}Sr_{0.1}Fe_{(1-x)}Mo_{(x)}O_3$).

The magnetoelectric layer 122 can comprise suitable perovskite materials, such as those comprising bismuth (Bi), iron, oxygen, and/or lanthanum, such as bismuth iron oxide ($BiFeO_3$ (BFO)) or lanthanum-doped bismuth iron oxide ($Bi_{1-x}La_x)FeO_3$ (LBFO). The inter-magnet insulating layer 112 can comprise ferromagnetic insulators such as $(Ni,Co)_{1+2x}Ti_{(1-x)}O_3$, $SrTi_{(1-x)}Co_xO_{(3-\delta)}$, $La_2MnNiO_6$, or $La_2CuIrO_6$.

The inter-magnet insulating layer 112 can comprise an insulator comprising tungsten (W), oxygen, sodium, tantalum, strontium, titanium, barium, potassium, lithium and/or niobium, such as $WO_3$, $NaTaO_3$, $SrTiO_3$, $BaTiO_3$, $KTaO_3$, $LiNbO_3$; in these embodiments, the ferromagnets 110a and 110b are coupled by magnetic dipole interaction.

The tunneling barrier 132 can comprise a suitable perovskite material, such as those comprising lanthanum, aluminum, tungsten, oxygen, sodium (Na), tantalum (Ta), strontium, titanium (Ti), barium (Ba), potassium (K), lithium (Li) and/or niobium (Nb), such as $LaAlO_3$, $WO_3$, $NaTaO_3$, $SrTiO_3$, $BaTiO_3$, $KTaO_3$, $LiNbO_3$.

The spin coherent layers 133a-b can comprise a suitable perovskite material, such as those comprising strontium, ruthenium (Ru), titanium, calcium (Ca), manganese (Mn) and/or oxygen, such as $SrTiO_3$, $SrRuO_3$, or $CaMnO_3$.

The spin-orbit coupling layer 134 can comprise a single layer of a suitable perovskite material, such as those comprising strontium, iridium (Ir), oxygen, and/or barium, such as $SrIrO_3$, $BaIrO_3$, and $Sr_2IrO_4$. In some embodiments, the spin-orbit coupling layer 134 can comprise two layers of suitable perovskite materials (e.g., layers 134a-b in FIG. 1D) comprising lanthanum, aluminum (Al), oxygen, strontium, titanium, and/or oxygen, such as $LaAlO_3$ and $SrTiO_3$.

FIGS. 1B-1D illustrate example multi-layer structures that can be utilized in the spin-orbit coupling module of the MESO device illustrated in FIG. 1A. In some embodiments, either a tunneling barrier or a spin coherent layer, but not both, is used to improve spin polarization of electrons injected into the spin-orbit coupling layer. FIGS. 1B and 1C illustrate multi-layer structures 180 and 182 in which a tunneling barrier or a spin coherent layer is used to improve spin polarization of electrons injected into the spin-orbit coupling layer from the ferromagnet, respectively. The multi-layer structure 180 comprises, from top to bottom, VDD conductive trace 106, ferromagnet 110b, tunneling barrier 132, spin-orbit coupling layer 134, spin coherent layer 133b, and GND conductive trace 108. The multi-layer structure 182 comprises, from top to bottom, VDD conductive trace 106, ferromagnet 110b, spin coherent layer 133a, spin-orbit coupling layer 134, spin coherent layer 133b, and GND conductive trace 108.

FIG. 1D illustrates a multi-layer stack 184 in which the spin-orbit coupling layer 134 comprises two layers. The stack 184 comprises, from top to bottom, VDD conductive trace 106, ferromagnet 110b, tunneling barrier 132, spin coherent layer 133a, spin-orbit coupling layers 134a and 134b, spin coherent layer 133b, and GND conductive trace 108. In other embodiments, the stack 184 comprises either the tunneling barrier 132 or the spin coherent layer 133a, but not both.

Figure 2:
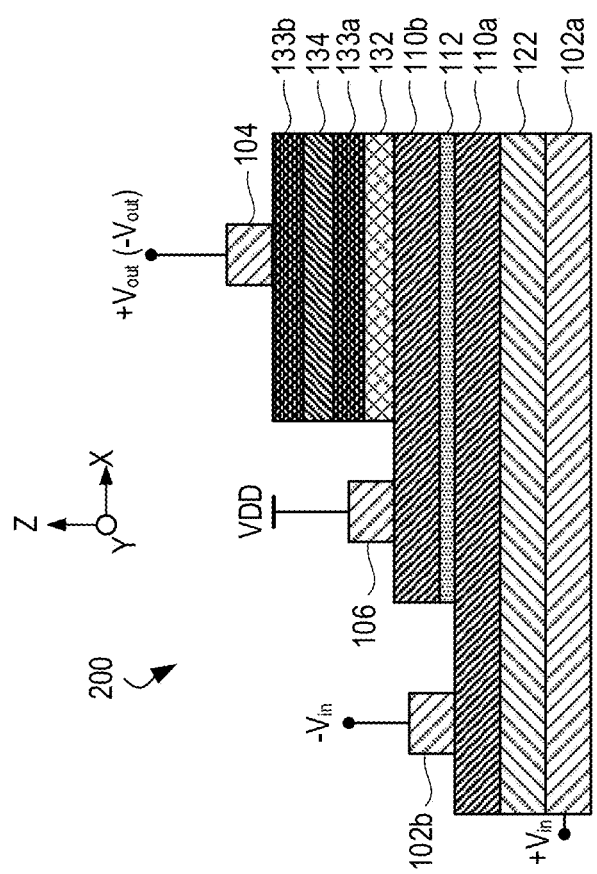
FIG. 2 illustrates a cross-sectional view of an example physical structure of the MESO device of FIG. 1A.

FIG. 2 illustrates a cross-sectional view of an example physical structure of the MESO device of FIG. 1A. Meso device 200 comprises the positive input voltage conductive trace $(+V_{in})$ 102a, the magnetoelectric layer 122 positioned adjacent to the positive input voltage conductive trace 102a, and the ferromagnet 110a positioned adjacent to the magnetoelectric layer 122 with the magnetoelectric layer 122 positioned between the ferromagnet 110a and the positive input voltage conductive trace 102a. The inter-magnet insulating layer 112 and the negative input voltage $(-V_{in})$ conductive trace are positioned adjacent to the ferromagnet 110a. The ferromagnet 110b is positioned adjacent to the inter-magnet insulating layer 112, with the inter-magnet insulating layer 112 positioned between the ferromagnets 110a-b. The tunneling barrier 132 and the power supply conductive trace 106 are positioned adjacent to the ferromagnet 110b with the tunneling barrier 132 positioned between the ferromagnet 110b and the spin coherent layer 133a. The spin-orbit coupling layer 134 is positioned between and adjacent to the spin coherent layers 133a-b and the positive output voltage conductive trace 104 is positioned adjacent to the spin coherent layer 133b.

The physical structure of a differential MESO devices comprising one of the multi-layer structures 180, 182, or 184 can have a cross-sectional view similar to the MESO device 200. For example, the physical structure of a differential MESO device comprising the multi-layer structure 180 can comprise the layers illustrated in the MESO device 200 but with the spin coherent layer 133a removed (that is, with the tunneling barrier 132 positioned adjacent to the spin-orbit coupling layer 134). Similarly, the physical structure of a MESO device comprising the multi-layer structure 182 can comprise the layers illustrated in the MESO device 200 but with tunneling barrier 132 removed (that is, with the spin coherent layer 133a positioned adjacent to the ferromagnet 110b).

Figure 3B:
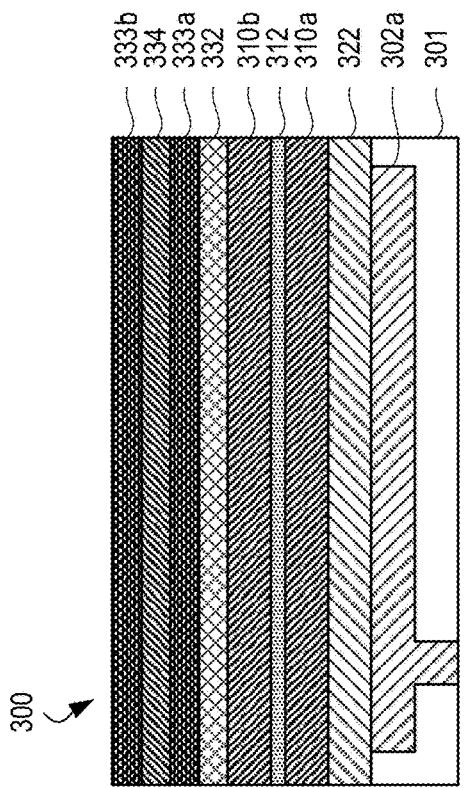
Figure 3D:
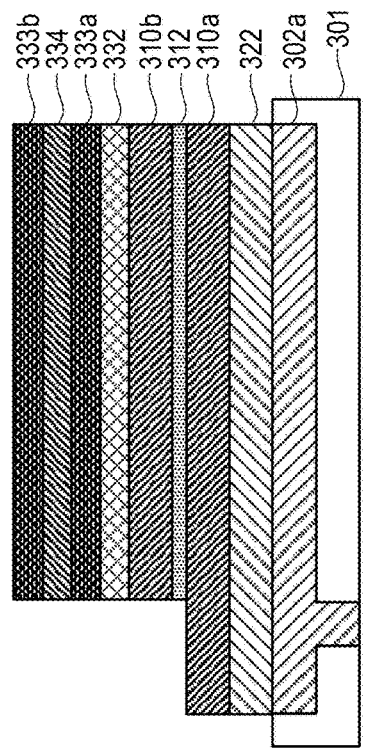

FIGS. 3A-3H illustrate cross-sectional views of an example differential input MESO device at various stages of fabrication. Moreover, FIG. 4 illustrates a flowchart of an example method for fabricating the differential input MESO device 300 of FIGS. 3A-H. It will be appreciated in light of the present disclosure that method 400 is only one example methodology for arriving at the example differential input MESO devices shown and described throughout this disclosure (e.g., MESO devices 100, 200, 300).

The method 400 may be performed using any suitable microelectronic fabrication technique. For example, film deposition—such as depositing layers, filling portions of layers (e.g., removed portions), and filling via openings—may be performed using any suitable deposition techniques, including, for example, chemical vapor deposition (CVD), metalorganic chemical vapor deposition (MOCVD), molecular beam epitaxy (MBE), atomic layer deposition (ALD), sputtering and/or physical vapor deposition (PVD). Moreover, patterning and removal—such as interconnect patterning, forming via openings, and shaping—may be performed using any suitable techniques, such as lithography-based patterning/masking and/or etching. Perovskite materials may be etched, for example, via dry etch (e.g., argon ion etching) or wet etch (e.g., HF wet etch) processes.

Figure 3A:
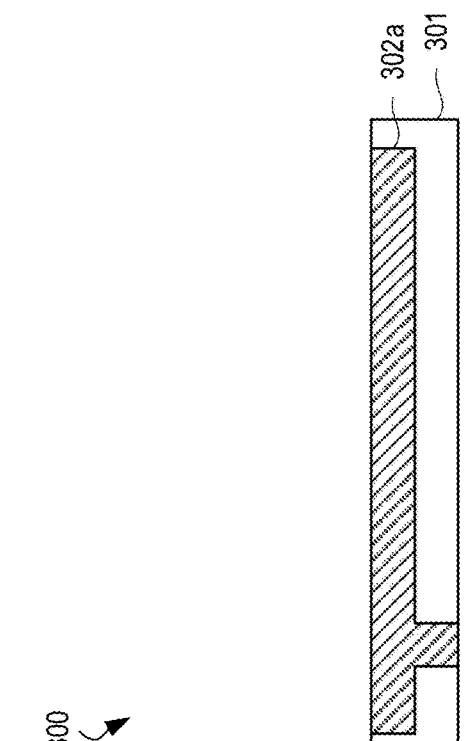
Figure 4:
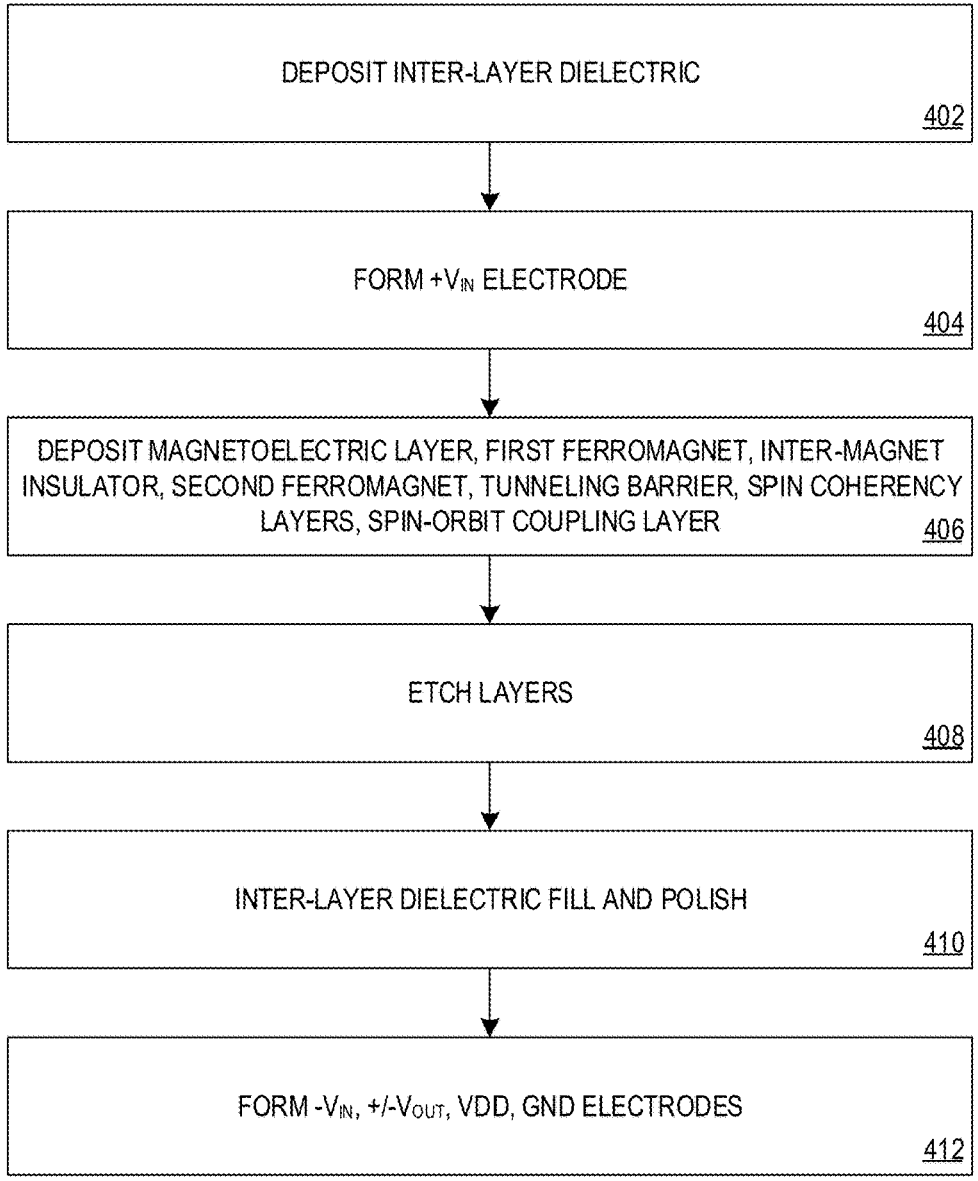
FIG. 4 illustrates a flowchart of an example method for fabricating a differential input MESO device.

The method begins at 402, where an inter-layer dielectric (ILD) 301 is deposited on or above a substrate (not shown), as shown in FIG. 3A. The inter-layer dielectric (ILD) 301 may be formed of a dielectric and/or insulating material (e.g., a low-k dielectric), which may comprise, for example, silicon (Si), oxygen, fluorine (F), and/or carbon (C), such as oxides of silicon (e.g., silicon dioxide ($SiO_2$)), doped oxides of silicon, fluorinated oxides of silicon, carbon-doped oxides of silicon, and/or any other low-k dielectric materials and combinations thereof. In some embodiments, an inter-layer dielectric positioned adjacent to a perovskite material in a MESO device can comprise a perovskite, such as lanthanum aluminum oxide ($LaAlO_3$ (LAO)).

At 404, one or more conductive traces are formed for the positive input voltage ($+V_{in}$) conductive trace 302a, as shown in FIG. 3A. For example, the conductive trace 302 is patterned in the ILD material 301 and then filled with a suitable interconnect material (e.g., one or more of the interconnect materials described throughout this disclosure). In some embodiments, for example, a via opening may be formed through the ILD 301 and then filled, and an interconnect layer may be patterned/etched above the via opening in the ILD and then filled.

At 406, the magnetoelectric layer 322, the first ferromagnet 310a, the inter-magnet insulating layer 312, the second ferromagnet 310b, the tunneling barrier 332, the spin coherent layer 333a, the spin-orbit coupling layer 334, and the spin coherent layer 333b, are deposited as shown in FIG. 3B. For example, the layers may be deposited from bottom to top in the order shown in FIG. 3B. In this manner, the magnetoelectric layer 322 is positioned adjacent to the positive input voltage ($+V_{in}$) conductive trace 302 (below) and the first ferromagnet 310a (above). The first ferromagnet 310a is positioned adjacent to the magnetoelectric layer 322 (below), and is positioned adjacent to the second ferromagnet 310b via the inter-magnet insulating layer 312 (above). The inter-magnet insulating layer 312 is positioned adjacent to the first ferromagnet 310a (below) and the second ferromagnet 310b (above). The second ferromagnet 310b is positioned adjacent to the inter-magnet insulating layer 312 (below) and the tunneling barrier 332 (above). The tunneling barrier 332 is positioned adjacent to the second ferromagnet 310b (below) and the spin coherent layer 333a (above). The spin coherent layer 333a is positioned adjacent to the tunneling barrier 332 (below) and the spin-orbit coupling layer 334 (above). The spin-orbit coupling layer 334 is positioned between and adjacent to the spin coherent layers 333a-b. Finally, the spin coherent layer 333b is positioned adjacent to the spin-orbit coupling layer 334 (below).

Figure 3C:
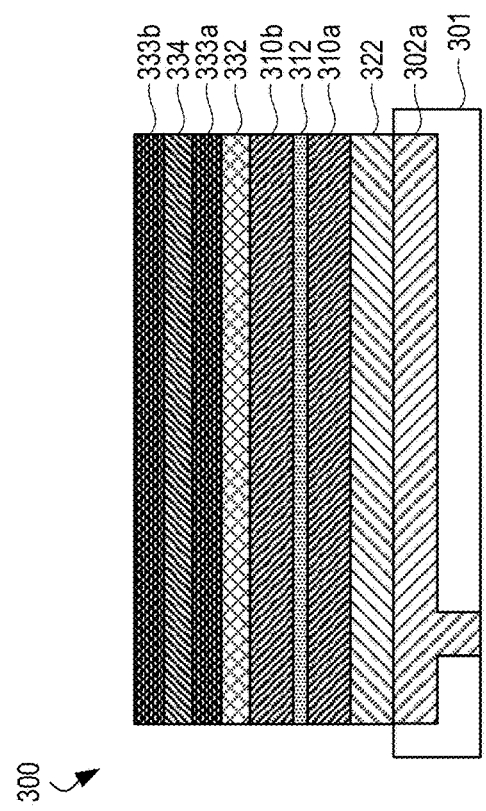

At 408, the MESO device 300 is shaped by etching away portions of various layers, as shown by FIGS. 3C, 3D, and 3E. For example, in FIG. 3C, the magnetoelectric layer 322, the first ferromagnet 310a, the inter-magnet insulating layer 312, the second ferromagnet 310b, the tunneling barrier 332, and the spin-orbit coupling layer 334 are etched on both sides (left and right sides) to align with the conductive trace 302a. In FIG. 3D, the inter-magnet insulating layer 312, the second ferromagnet 310b, the tunneling barrier 332, and the spin-orbit coupling layer 334 are further etched on one side (e.g., left side), with the etch stopping on the ferromagnet 310a. In FIG. 3E, the tunneling barrier 332, the spin coherent layers 333a-b, and the spin-orbit coupling layer 334 are etched further on the same side as in FIG. 3D (e.g., left side), with the etch stopping on the ferromagnet 110b.

In this manner, the respective layers are staggered on one side (e.g., left side), such that (i) the conductive trace 302a, the magnetoelectric layer 322, and first ferromagnet 310a extend laterally the furthest, followed by (ii) the inter-magnet insulating layer 312 and the ferromagnet 310b, followed by (iii) the tunneling barrier 332, the spin coherent layers 333a-b, and the spin-orbit coupling layer 334.

At 410, the removed portions are filled with an inter-layer dielectric (ILD) 301, which is then polished, as shown in FIG. 3F. As mentioned above, the ILD can comprise a perovskite material. A metallization or ILD stack can comprise perovskite and non-perovskite ILDs. A perovskite ILD can be used where there are perovskite-based MESO devices between interconnect layers and non-perovskite ILDs can be used otherwise. The use of a perovskite as an ILD material adjacent to MESO devices comprising perovskite materials can provide for high-quality interfaces between perovskite MESO device layers and the perovskite ILD.

At 412, the negative input voltage ($-V_{in}$) conductive trace 302b, the positive/negative ($+/-V_{out}$) output conductive traces 304 (although only one is illustrated in FIGS. 3G and 3H), and the power supply conductive trace ($V_{DD}$) 306, are formed as shown in FIGS. 3G and 3H. In particular, via openings for the interconnects are formed in FIG. 3G, and the via openings are then filled and polished in FIG. 3H. For example, in FIG. 3G, (i) a via opening for a conductive trace 302b that acts as the $-V_{in}$ negative input voltage conductive trace is formed through the ILD 301 to the ferromagnet 310a; (ii) a via opening for conductive trace 304 that acts as the $+V_{out}$ differential output voltage conductive trace is formed through the ILD 301 to the spin coherent layer 333b; and (iii) a via opening for a conductive trace 306 that acts as the power supply terminal ($V_{DD}$) is formed through the ILD 301 to the ferromagnet 310b. In FIG. 3H, the respective via openings are filled using any suitable interconnect material (e.g., one or more of the interconnect materials described throughout this disclosure) and polished.

At this point, the method 400 may be complete. In some embodiments, however, the method 400 may restart and/or certain elements of the method 400 may be repeated. For example, in some embodiments, the method 400 may restart at 402 to fabricate another MESO device with the same or different design on top of another MESO device.

FIGS. 5A and 5B illustrate example BFO/LSMO interfaces in a MESO device comprising perovskite layers. The BFO/LSMO interfaces 500 and 502 can be interfaces between the magnetoelectric layer and an input conductive trace of a MESO device. The interface 500 illustrates an interface between an LSMO input conductive trace layer 510 and a BFO magnetoelectric layer 512 where the LSMO input conductive trace layer 504 terminates on a layer comprising bismuth and oxygen atoms that are part of a BFO magnetoelectric layer 508. The interface 502 illustrates an interface where an LSMO input conductive trace layer 510 terminates on a layer comprising lanthanum, strontium, and oxygen atoms that are part of the LSMO layer 510. FIGS. 5A and 5B illustrate the lattice matching of the BFO and LSMO materials and is representative of the lattice matching that occurs at interfaces between perovskite layers in perovskite-based MESO devices.

Figure 6B:
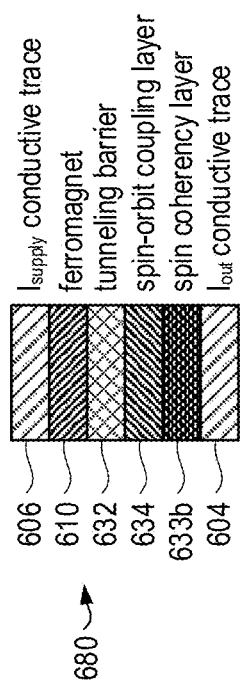
FIGS. 6B-6D illustrate example multi-layer structures that can be utilized in the spin-orbit coupling module of the MESO device illustrated in FIG. 6A.
Figure 6C:
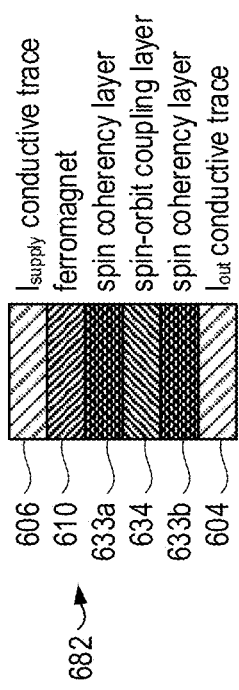
Figure 6D:
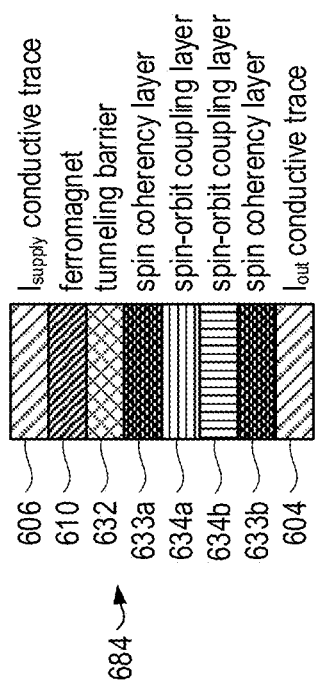
Figure 6A:
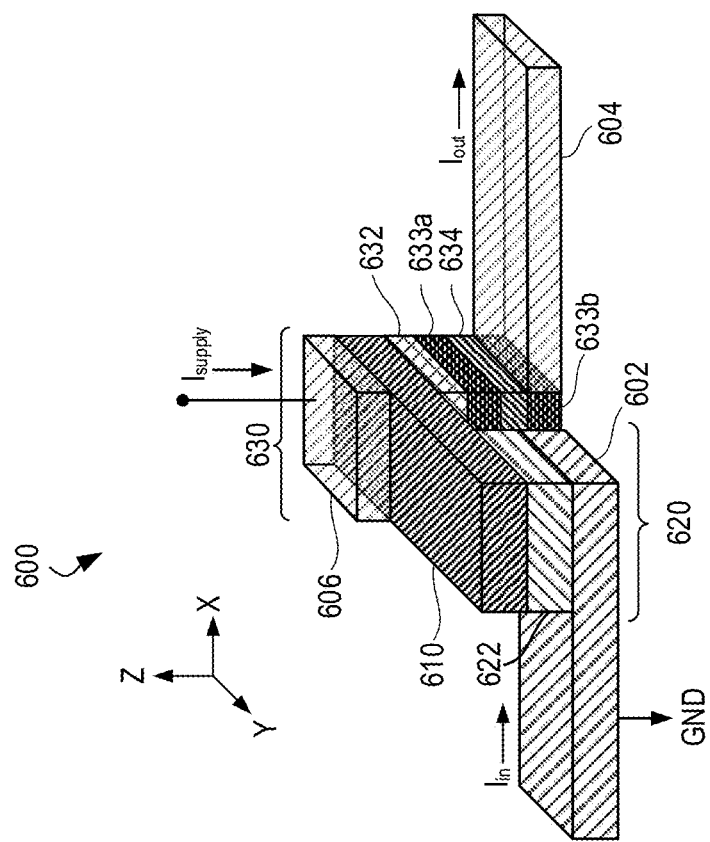
FIG. 6A illustrates an example single-ended MESO logic device.

FIG. 6A illustrates an example single-ended MESO logic device. MESO device 600 comprises a single-ended input, a single-ended output, and a ferromagnet comprising a single ferromagnetic layer (instead of the two ferromagnetic layers comprising the ferromagnet of MESO device 100). MESO device 600 comprises a ferromagnet 610, a magnetoelectric conversion module 620, and a spin-orbit conversion structure 630. MESO device 600 further comprises conductive traces, portions of which serve to provide input and supply currents $I_{in}$ and $I_{supply}$, carry output current $I_{out}$, and provide ground. For example, conductive trace 602 provides input current $I_{in}$ and is tied to ground, conductive trace 604 carries output current $I_{out}$, and conductive trace 606 provides supply current $I_{supply}$.

The operation of the single-ended MESO device 600 comprising a ferromagnet having a single ferromagnetic layer is similar to that of the differential MESO device 100 comprising a ferromagnetic having two ferromagnetic layers separated by an inter-magnet insulating layer, and layers and components in the MESO device 600 perform similar functions and have the similar characteristics as similarly numbered layers and components in FIG. 1A (e.g., magnetoelectric layer 622 in FIG. 6A performs similarly to and has similar characteristics as the magnetoelectric layer 122 in FIG. 1A).

The magnetoelectric module 620 includes a structure (e.g., stack of layers) configured to convert an electric charge current into spin (e.g., magnetization). For example, the magnetoelectric structure 620 is formed by the positive input current conductive trace 602 ($I_{in}$), which in turn is coupled to a magnetoelectric layer 622, which in turn is coupled to ferromagnet 610. The magnetoelectric structure 620 is configured as a capacitor, with ferromagnet 610 and input current conductive trace 602 serving as electrical plates surrounding the magnetoelectric layer 622. The orientation of magnetization of the ferromagnet 610 can be switched based on the input current ($I_{in}$) as described above in regards to how the magnetization of the ferromagnet 110 can be switched based on the input voltage differential ($+/-V_{in}$). This setting of the orientation of magnetization of the ferromagnet 610 affects the output of the spin-orbit structure 630, as described above in regards to the spin-orbit structure 130 of FIG. 1A. The spin-orbit structure 630 includes a power supply ($I_{supply}$) conductive trace 606 coupled to the ferromagnet 610, which in turn is couple, via a tunneling barrier 632, to a spin coherent layer 633a. The spin coherent layer 633a is coupled to a spin-orbit coupling layer 634, which in turn is coupled to a spin coherent layer 633b, which is in coupled to the output conductive trace 604.

Like the MESO device 100, perovskite materials can be used for the conductive traces 602, 604, and 606, interconnects connecting to the conductive traces 602, 604, and 606, the magnetoelectric layer 622, the ferromagnet 610, the tunneling barrier 632, the spin coherent layers 633a-b, and the spin-orbit coupling layer 634.

MESO conductive traces carrying or providing input signals, output signals, power, and ground (e.g., 602, 604, and 606), and interconnects connecting to these conductive traces can comprise suitable perovskite materials, such as those comprising lanthanum, strontium, manganese, oxygen, niobium, and/or ruthenium, such as lanthanum strontium oxide ($La_{(1-x)}Sr_{(x)}MnO_3$ (LSMO)), niobium-doped strontium titanate (Nb—$SrTiO_3$ (Nb-STO)), and/or $SrRuO_3$ (SRO). The ferromagnet 610 can comprise suitable perovskite materials, such as those comprising lanthanum, strontium, molybdenum, iron, and/or oxygen, such as LSMO and $La_{(1-x)}Sr_{(x)}Fe_{(1-y)}Mo_{(y)}O_3$ (LSFMO) (e.g., $La_{0.9}Sr_{0.1}Fe(1-x)Mo_{(x)}O_3$. The magnetoelectric layer 622 can comprise suitable perovskite materials, such as those comprising bismuth, iron, oxygen, and/or lanthanum, such as bismuth iron oxide ($BiFeO_3$ (BFO)) or lanthanum-doped bismuth iron oxide ($Bi_{1-x}La_x)FeO_3$ (LBFO).

The tunneling barrier 632 can comprise a suitable perovskite material, such as those comprising lanthanum, aluminum, tungsten, oxygen, sodium, tantalum, strontium, titanium, barium, potassium, lithium, and/or niobium, such as $LaAlO_3$, $WO_3$, $NaTaO_3$, $SrTiO_3$, $BaTiO_3$, $KTaO_3$, $LiNbO_3$. The spin coherent layers 633a-b can comprise a suitable perovskite material comprising strontium, ruthenium, titanium, calcium, manganese, and/or oxygen, such as $SrTiO_3$, $SrRuO_3$, or $CaMnO_3$. The spin-orbit coupling layer 634 can comprise a single layer of a suitable perovskite material comprising strontium, iridium, oxygen, and/or barium, such as $SrIrO_3$, $BaIrO_3$, and $Sr_2IrO_4$. In some embodiments, the spin-orbit coupling layer 134 can comprise two layers of suitable perovskite materials (e.g., layers 634a-b in FIG. 6D) comprising lanthanum, aluminum, oxygen, strontium, titanium, and/or oxygen, such as $LaAlO_3$ and $SrTiO_3$.

FIGS. 6B-6D illustrate example multi-layer structures that can be utilized in the spin-orbit coupling module of the MESO device illustrated in FIG. 6A. FIGS. 6B and 6C illustrate multi-layer structures 680 and 682 in which a tunneling barrier or a spin coherent layer are used to improve spin polarization of electrons injected into the spin-orbit coupling layer from the ferromagnet, respectively. The multi-layer structure 680 comprises, from top to bottom, $I_{supply}$ conductive trace 606, ferromagnet 610, tunneling barrier 632, spin-orbit coupling layer 634, spin coherent layer 633b, and I$_{out}$ conductive trace 604. The multi-layer structure 682 comprises, from top to bottom, I$_{supply}$ conductive trace 606, ferromagnet 610, spin coherent layer 633a, spin-orbit coupling layer 634, spin coherent layer 633b, and I$_{out}$ conductive trace 604.

FIG. 6D illustrates a multi-layer stack 684 in which the spin-orbit coupling layer 634 comprises two layers 634a and 634b. The stack 684 comprises, from top to bottom, I$_{supply}$ conductive trace 606, ferromagnet 610, tunneling barrier 632, spin coherent layer 633a, spin-orbit coupling layers 634a-b, spin coherent layer 633b, and I$_{out}$ conductive trace 604. In other embodiments, the stack 684 comprises either the tunneling barrier 632 or the spin coherent layer 633a, but not both of these layers.

Figure 7:
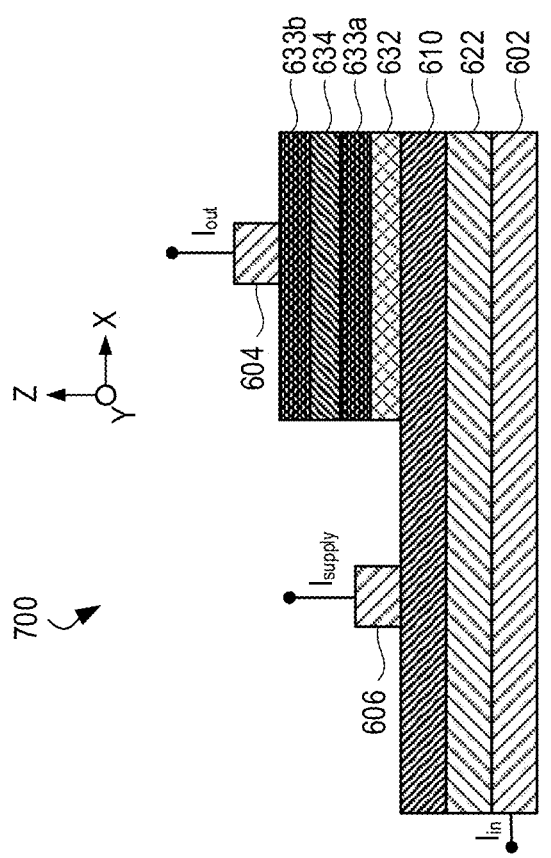
FIG. 7 illustrates a cross-sectional view of an example physical structure of the MESO device of FIG. 6A.

FIG. 7 illustrates a cross-sectional view of an example physical structure of the MESO device of FIG. 6A. Meso device 700 comprises the input current conductive trace 602, the magnetoelectric layer 622 positioned adjacent to the input current conductive trace 602, and the ferromagnet 610 positioned adjacent to the magnetoelectric layer 622, with the magnetoelectric layer 622 positioned between the input current conductive trace 602 and the ferromagnet 610. The tunneling barrier 632 and the supply current conductive trace 606 are positioned adjacent to the ferromagnet 610. The spin coherent layer 633a is positioned adjacent to the tunneling barrier 632 and the spin-orbit coupling layer 634 is positioned between and adjacent to the spin coherent layers 633a-b. The spin coherent layer 633b is positioned adjacent to the spin-orbit coupling layer 634 and the output current conductive trace 604 is positioned adjacent to the spin coherent layer 633b.

The physical structure of a single-ended MESO devices comprising one of the multi-layer structures 680, 682, or 684 can have a cross-sectional view similar to the MESO device 200. For example, the physical structure of a single-ended MESO device comprising the multi-layer structure 680 can comprise the layers illustrated in the MESO device 700 but with spin coherent layer 633a removed (that is, with the tunneling barrier 632 positioned adjacent to the spin-orbit coupling layer 634). Similarly, the physical structure of a MESO device comprising the multi-layer structure 682 can comprise the layers illustrated in the MESO device 700 but with tunneling barrier 632 removed (that is, with the spin coherent layer 633a positioned adjacent to the ferromagnet 610).

FIGS. 8A-8G illustrate cross-sectional views of an example single-ended input MESO device at various stages of fabrication. Moreover, FIG. 9 illustrates a flowchart of an example method for fabricating the singled-ended input MESO device of FIGS. 8A-H. It will be appreciated in light of the present disclosure that method 900 is only one example methodology for arriving at the example single-ended MESO devices shown and described throughout this disclosure (e.g., MESO devices 600, 700, 800).

The method 900 may be performed using any suitable microelectronics fabrication techniques, including those described above as being suitable for performing the method 400. The method begins at 902, where an inter-layer dielectric (ILD) 801 is deposited on or above a substrate (not shown), as shown in FIG. 8A. The inter-layer dielectric 801 may be formed of a dielectric and/or insulating material (e.g., a low-k dielectric), which may include, for example, silicon, oxygen, fluorine, and/or carbon, such as oxides of silicon (e.g., silicon dioxide (SiO$_2$)), doped oxides of silicon, fluorinated oxides of silicon, carbon-doped oxides of silicon, and/or any other low-k dielectric materials and combinations thereof. In some embodiments, an inter-layer dielectric positioned adjacent to a perovskite material in a MESO device can comprise a perovskite material, such as LAO.

At 904, one or more conductive traces are formed for the input current conductive trace 802, as shown in FIG. 8A. For example, the conductive trace 802 is patterned in the ILD material 801 and then filled with a suitable interconnect material (e.g., one or more of the interconnect materials described throughout this disclosure). In some embodiments, for example, a via opening may be formed through the ILD 801 and then filled, and an interconnect layer may be patterned/etched above the via opening in the ILD and then filled.

Figure 8B:
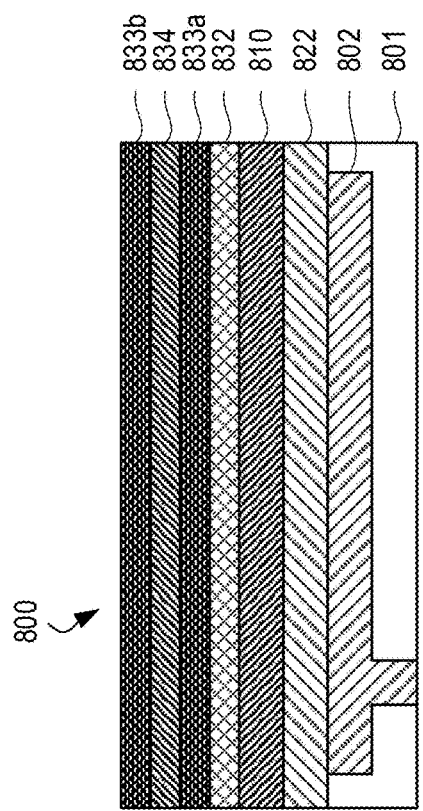
FIGS. 8A-8G illustrate cross-section views of an example single-ended input MESO device at various stages of fabrication.
Figure 9:
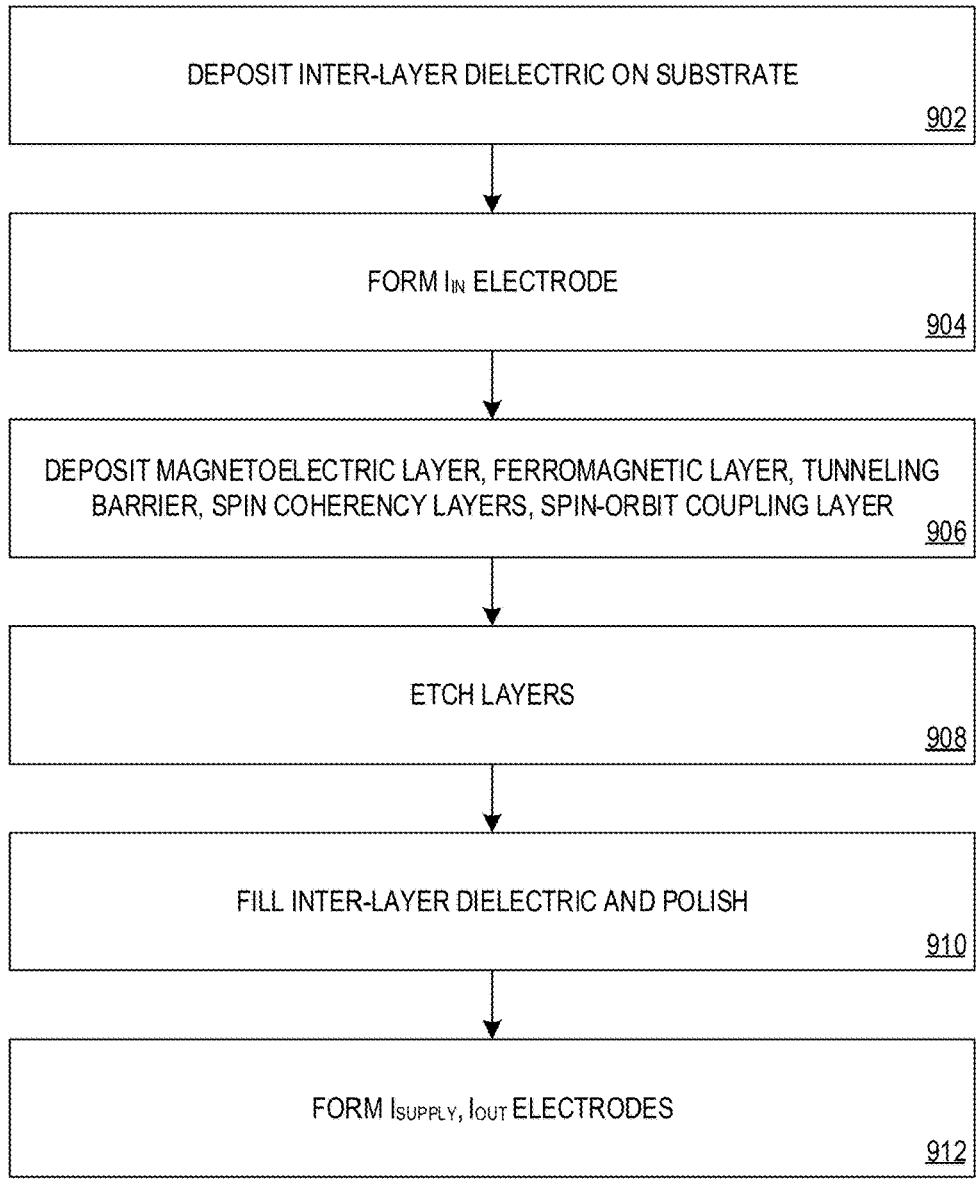
FIG. 9 illustrates a flowchart of an example method for fabricating the differential MESO device of FIGS. 8A-G.

At 906, the magnetoelectric layer 822, the ferromagnet 810, the tunneling barrier 832, the spin coherent layer 833a, the spin-orbit coupling layer 834, and the spin coherent layer 833b are deposited as shown in FIG. 8B. These layers may be deposited from bottom to top in the order shown in FIG. 8B. In this manner, the magnetoelectric layer 822 is positioned adjacent to the input current conductive trace 802 (below) and the ferromagnet 810 (above). The ferromagnet 810 is positioned adjacent to the magnetoelectric layer 822 (above), and is positioned adjacent to the tunneling barrier 832 (above). The tunneling barrier 832 is positioned adjacent to the ferromagnet 810 (below) and the spin coherent layer 833a (above). The spin coherent layer 833a is positioned adjacent to the tunneling barrier 832 (below) and the spin-orbit coupling layer 834 (above). The spin-orbit coupling layer 834 is positioned between and adjacent to the spin coherent layers 833a-b. Finally, the spin coherent layer 833b is positioned adjacent to the spin-orbit coupling layer 834 (below).

Figure 8D:
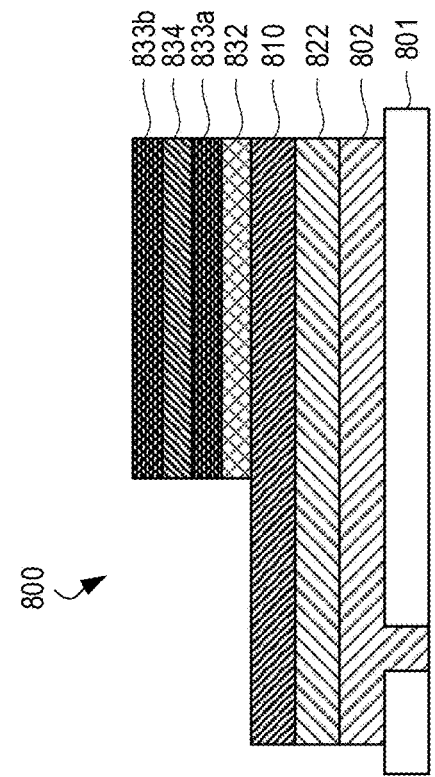
Figure 8A:
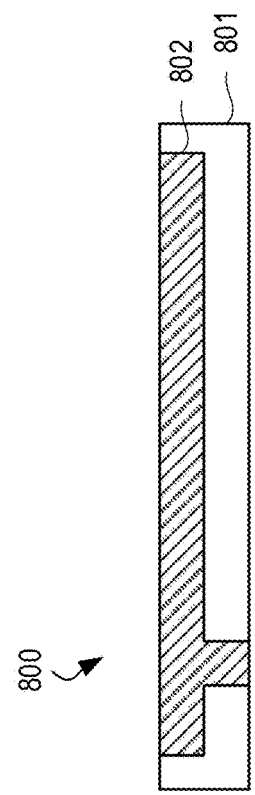
Figure 8C:
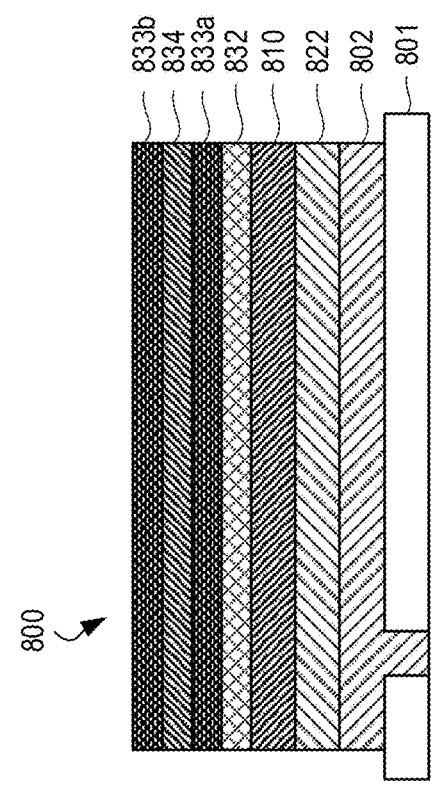

At 908, the MESO device 800 is shaped by etching away portions of various layers, as shown by FIGS. 8C and 8D. For example, in FIG. 8C, the magnetoelectric layer 822, the ferromagnet 810, the tunneling barrier 832, the spin coherent layers 833a-b, and the spin-orbit coupling layer 834 are etched on both sides (left and right sides) to align with the conductive trace 802. In FIG. 8D, tunneling barrier 832, the spin coherent layers 833a-b, and the spin-orbit coupling layer 834 are further etched on one side (e.g., left side), stopping on the ferromagnet 810.

In this manner, the respective layers are staggered on one side (e.g., left side), such that the conductive trace 802, the magnetoelectric layer 822, and ferromagnet 810 extend laterally the furthest, followed by the tunneling barrier 832, the spin coherent layers 833a-b, and the spin-orbit coupling layer 834.

Figure 8E:
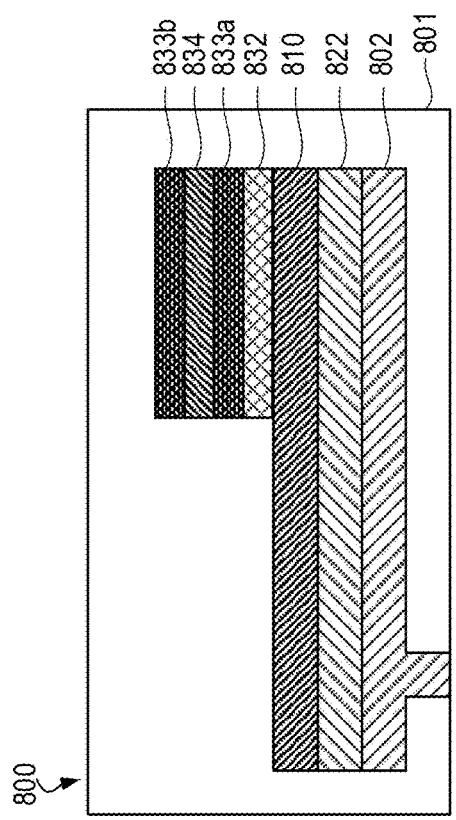

At 910, the removed portions are filled with an inter-layer dielectric (ILD) 801, which is then polished, as shown in FIG. 8E. As mentioned above, the ILD can comprise a perovskite material.

Figure 8G:
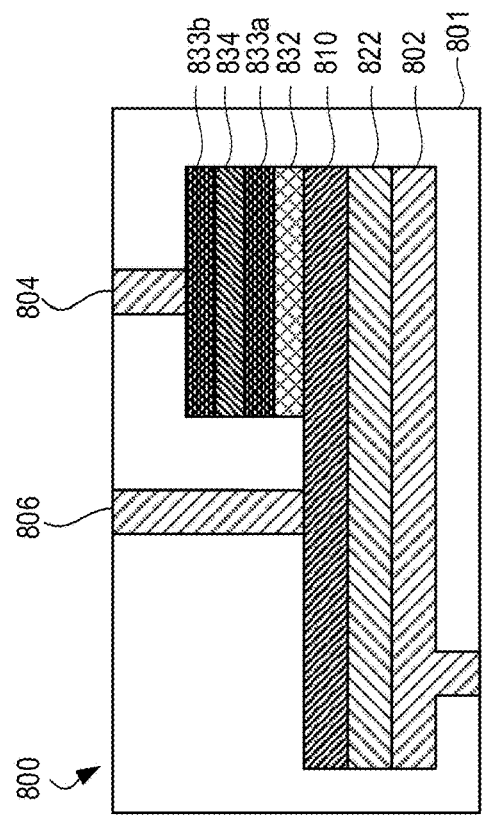
Figure 8F:
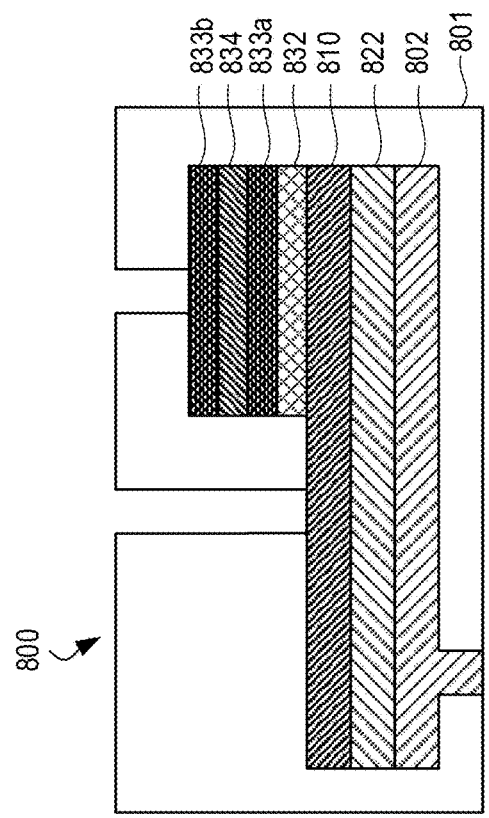

At 912, the output current conductive trace 802 and the supply current conductive trace 806, are formed as shown in FIGS. 8F and 8G. In particular, via openings for the conductive traces are formed in FIG. 8F, and the via openings are then filled and polished in FIG. 8G. For example, in FIG. 8F, a via opening for the supply current conductive trace 806 that is formed through the ILD 801 to the ferromagnet 810, and a via opening for the output current conductive trace 804 is formed through the ILD 801 to the spin-orbit coupling layer 834.

At this point, the method 900 may be complete. In some embodiments, however, the method 900 may restart and/or certain elements of the method 900 may be repeated. For example, in some embodiments, the method 900 may restart at 902 to fabricating another MESO device with the same or different design on top of another MESO device.

Although the MESO devices illustrated in FIGS. 1A, 2, 3A-3H, 6A, 7A, and 8A-8G have been described as having their constituent layers and components being made of perovskite materials, in other embodiments, MESO devices can comprise a combination of perovskite and non-perovskite layers and components. For example, input voltage/current conductive traces and the magnetoelectric layer can both be made of perovskite materials and the other layers and components of the MESO device can comprise non-perovskite materials.

A MESO device can comprise non-perovskite materials as follows. The interconnects (e.g., 102*a-b*, 104*a-b*, 106, 108, 602, 604, 606) may be formed of any suitable conductive material (e.g., metal), such as a material that includes, for example, copper (Cu), silver (Ag), aluminum (Al), gold (Au), cobalt (Co), tungsten (W), tantalum (Ta), nickel (Ni), and/or graphene. Moreover, conductive traces associated with an input voltage/current, output voltage/current, power supply voltage/current, and/or ground connections may be formed of a material that includes, for example, strontium, ruthenium, oxygen, platinum (Pt), lanthanum, and/or manganese (Mn), such as $SrRuO_3$, Ru, Pt, and/or $La_{(1-x)}Sr_{(x)}MnO_3$, among other examples. In some embodiments, the thickness of the conductive traces may range from 1-20 nanometers (nm).

Ferromagnets (e.g., 110*a-b*, 610) may be formed of any suitable magnetic material, such as a material that includes, for example, cobalt, iron, nickel, gadolinium (Gd), and/or their alloys, such as CoFe, CoFeB and/or NiFe, or a magnetic oxide that includes, for example, lanthanum, strontium, manganese (Mn), oxygen, calcium (Ca), and/or titanium (TI), such as $La_{(1-x)}Sr_{(x)}MnO_3$, Co-doped or Fe-doped perovskite oxide (e.g., $CaTiO_3$), and/or any other type of oxide magnet, among other examples.

The inter-magnet insulating layer 112 can comprise a ferrimagnetic material, such as a material that comprises, for example, ytterbium (Yb), iron, oxygen, nickel, cobalt, titanium, magnesium (Mg), aluminum, zinc (Zn), barium, strontium, hafnium (Hf), silicon, nitrogen (N), and/or europium (Eu), such as ytterbium iron garnet ($Yb_3Fe_2(FeO_4)_3$, $Yb_3Fe_5O_{12}$), $MgAl_{0.5}Fe_{1.5}O_4$ (MAFO), $NiAl_xFe_{2-x}O_4$ (NiAFO), a ferromagnetic semiconductor such as EuO, a spinel ferrite such as $Fe_3O_4$, $CoFe_2O_4$, $Fe_2O_3$, $Co_2O_3$, $Co_2FeO_4$, $Ni_2FeO_4$, a hexagonal ferrite having the general chemical formula $A_xMe_yFe_zO_j$ (where A can be Ba or Sr and Me can be $Co^{2+}$, $Ni^{2+}$ or $Zn^{2+}$), such as $BaFe_{12}O_{19}$, or an oxide or nitride insulator such as MgO, $Al_2O_3$, $TiO_2$, $SiO_2$, $Si_3N_4$, $HfO_2$. In some embodiments, the thickness of the inter-magnet insulating layer 112 is in the range of 1-5 nanometers (nm).

The magnetoelectric layer 122 may be formed of any suitable magnetoelectric and/or multiferroic material (e.g., a multiferroic oxide), such as a material that includes, for example, bismuth, chromium (Cr), boron (B), iron, oxygen, lutetium (Lu), lanthanum, titanium, lead (Pb), zirconium (Zr), terbium (Tb), magnesium, and/or niobium, such as bismuth ferrite (BFO) (e.g., $BiFeO_3$), LFO (e.g., hexagonal $LuFeO_3$, $LuFe_2O_4$), doped BFO (e.g., $BiFeO_3$ doped with lanthanum, $(Bi_{1-x}La_x)FeO_3$ (LBFO)), chromium oxide ($Cr_2O_3$), and doped chromium oxide (e.g., $Cr_2O_3$ doped with boron, $BiTiO_3$, $TbMnO_3$, lead zirconate titanate (PZT), and/or lead magnesium niobate-lead titanate (PMN-PT), among other examples. In some embodiments, the magnetoelectric layer 122 is a multi-layer magnetoelectric structure comprising constituent layers that act together to produce a room-temperature magnetoelectric, such as $LuFeO_3$/$LuFe_2O_4$ or $LuFeO_3$/$CoFe_2O_4$ multi-layers. In some embodiments, the thickness of the magnetoelectric layer 122 may range from 1-100 nanometers (nm).

The spin-orbit coupling structure can comprise a layer comprising Ag positioned adjacent to the ferromagnet and a second layer positioned between the first layer and the output conductive trace, the second layer comprising Bi or W. In some embodiments, a third layer comprising Ta, W, or Pt may be positioned between the first layer and the second of the spin-orbit coupling stack.

The MESO devices 100 and 600 may be implemented using other types, numbers, and/or arrangements of components than shown in FIGS. 1A-1D and 6A-6D. For example, certain components of MESO device 100 may be added, replaced, omitted, and/or rearranged.

The MESO devices described herein can be used in any processor unit, integrated circuit component, or computing system described or referenced herein. MESO devices can be fabricated as part of an integrated circuit structure. The integrated circuit structure can comprise a die substrate, such as a die substrate comprising silicon, and one or more interconnect layers. A conductive trace of a MESO device can connect to lines of an interconnect layer by a via or by being positioned adjacent to a line of an interconnect layer. The integrated circuit structure can comprise other types of devices, such as electronic transistors (transistors such as CMOS transistors that operate through control of the flow of electric current and that do not rely upon the switching of the magnetization of a layer or component for operation) and a MESO device can connect to other MESO devices or other device types in the integrated circuit structure by one or more of the interconnect layers or by being directly connected to another MESO device or other device type.

As discussed above, MESO devices can be used as logic devices in cascading logic. Majority logic gates are one type of logic gate in which MESO gates can be utilized. A majority gate is a logic gate in which the output is true (e.g., output voltage is positive) if more than half of the inputs to the majority gate are true (e.g., input voltage is positive) and the output is false (e.g., output voltage is negative) if more than half of the inputs are false (e.g., input voltage is negative). In one example of a MESO majority gate, the outputs of three input MESO devices can be connected to the input of a MESO majority gate. The output of the majority gate will be true if two or three outputs of the input MESO devices are true.

Figure 10:
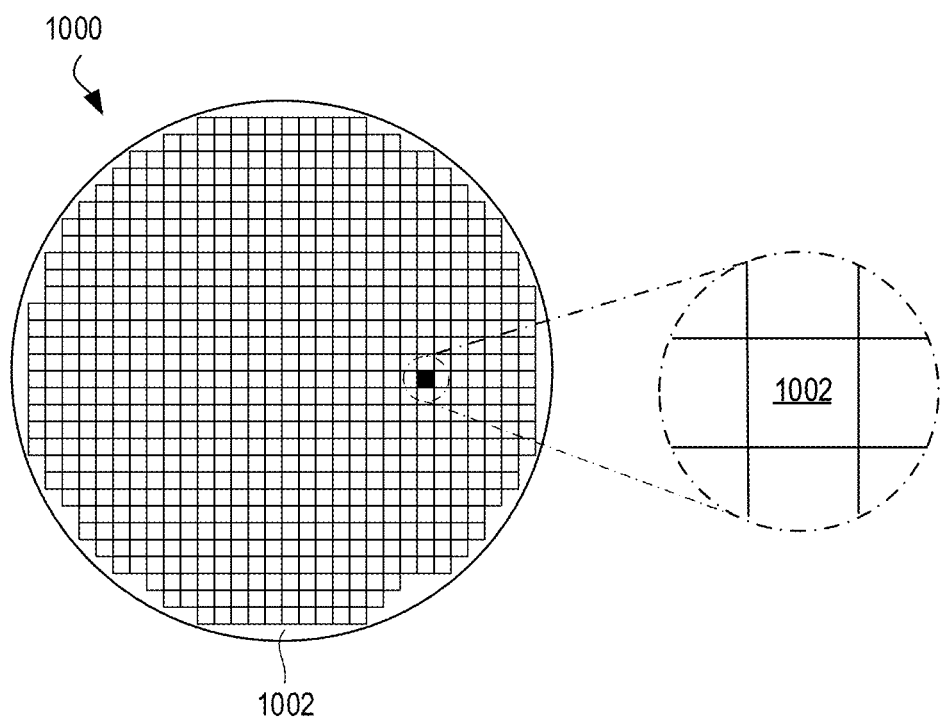
FIG. 10 is a top view of a wafer and dies that may be included in a microelectronic assembly, in accordance with any of the embodiments disclosed herein.

FIG. 10 is a top view of a wafer 1000 and dies 1002 that may include one or more MESO devices as disclosed herein. The wafer 1000 may be composed of semiconductor material and may include one or more dies 1002 having integrated circuit structures formed on a surface of the wafer 1000. The individual dies 1002 may be a repeating unit of an integrated circuit product that includes any suitable integrated circuit. After the fabrication of the integrated circuit product is complete, the wafer 1000 may undergo a singulation process in which the dies 1002 are separated from one another to provide discrete "chips" of the integrated circuit product. The die 1002 may be any of the processing units or integrated circuit components disclosed herein. The die 1002 may include one or more transistors (e.g., some of the electronic transistors 1140 of FIG. 11, discussed below, spintronic transistors, supporting circuitry to route electrical signals to the transistors, passive components (e.g., signal traces, resistors, capacitors, or inductors), and/or any other integrated circuit components. In some embodiments, the wafer 1000 or the die 1002 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1002. For example, a memory array formed by multiple memory devices may be formed on a same die 1002 as a processor unit (e.g., the processor unit 1402 of FIG. 14) or other logic that is configured to store information in the memory devices or execute instructions stored in the memory array. Various microelectronic assemblies may be manufactured using a die-to-wafer assembly technique in which some dies are attached to a wafer 1000 that include others of the dies, and the wafer 1000 is subsequently singulated.

Figure 11:
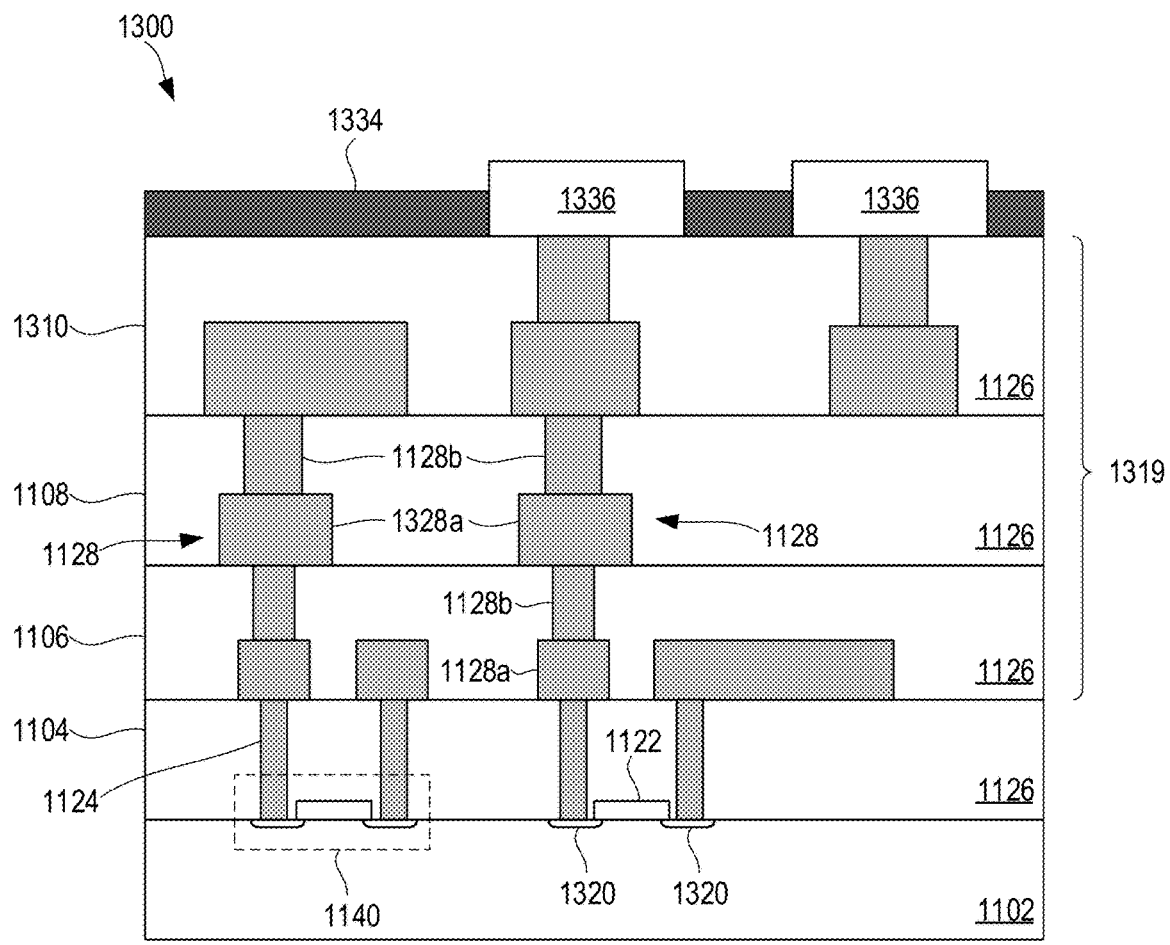
FIG. 11 is a cross-sectional side view of an integrated circuit device that may be included in a microelectronic assembly, in accordance with any of the embodiments disclosed herein.

FIG. 11 is a cross-sectional side view of an integrated circuit device 1100 that may be included in any of the processor units, integrated circuit components or other components disclosed or referenced herein. One or more of the integrated circuit devices 1100 may be included in one or more dies 1002 (FIG. 10). The integrated circuit device 1100 may be formed on a die substrate 1102 (e.g., the wafer 1000 of FIG. 10) and may be included in a die (e.g., the die 1002 of FIG. 10). The die substrate 1102 may be a semiconductor substrate composed of semiconductor material systems including, for example, n-type or p-type materials systems (or a combination of both). The die substrate 1102 may include, for example, a crystalline substrate formed using a bulk silicon or a silicon-on-insulator (SOI) substructure. In some embodiments, the die substrate 1102 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1102. Although a few examples of materials from which the die substrate 1102 may be formed are described here, any material that may serve as a foundation for an integrated circuit device 1100 may be used. The die substrate 1102 may be part of a singulated die (e.g., the dies 1002 of FIG. 10) or a wafer (e.g., the wafer 1000 of FIG. 10).

The integrated circuit device 1100 may include one or more device layers 1104 disposed on the die substrate 1102. The device layer 1104 may include features of one or more electronic transistors 1140 (e.g., metal oxide semiconductor field-effect transistors (MOSFETs)) formed on the die substrate 1102. The transistors 1140 may include, for example, one or more source and/or drain (S/D) regions 1120, a gate 1122 to control current flow between the S/D regions 1120, and one or more S/D contacts 1124 to route electrical signals to/from the S/D regions 1120. The transistors 1140 may include additional features not depicted for the sake of clarity, such as device isolation regions, gate contacts, and the like. The transistors 1140 are not limited to the type and configuration depicted in FIG. 11 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors. The integrated circuit device 1100 can further include spintronic devices, such as the MESO devices described herein.

FIGS. 12A-12D are simplified perspective views of example planar, FinFET, gate-all-around, and stacked gate-all-around transistors. The transistors illustrated in FIGS. 12A-12D are formed on a substrate 1216 having a surface 1208. Isolation regions 1214 separate the source and drain regions of the transistors from other transistors and from a bulk region 1218 of the substrate 1216.

Figure 12B:
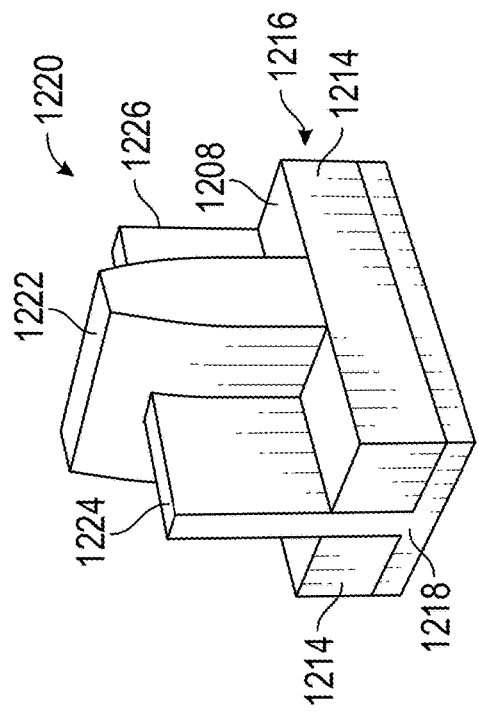
FIGS. 12A-12D are perspective views of example planar, FinFET, gate-all-around, and stacked gate-all-around transistors.
Figure 12D:
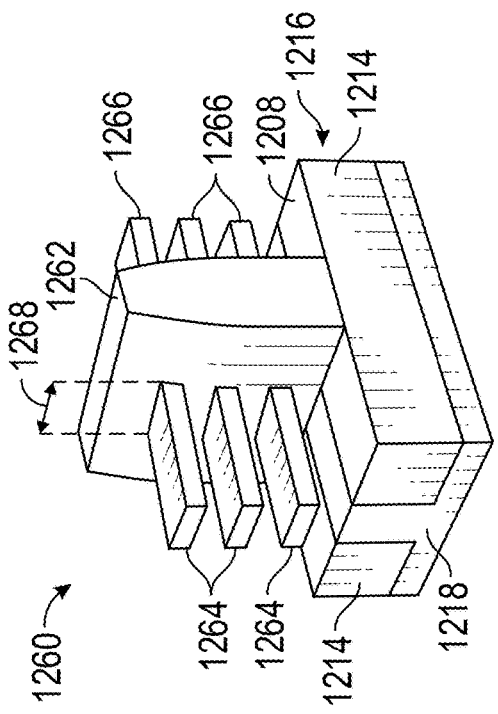
Figure 12A:
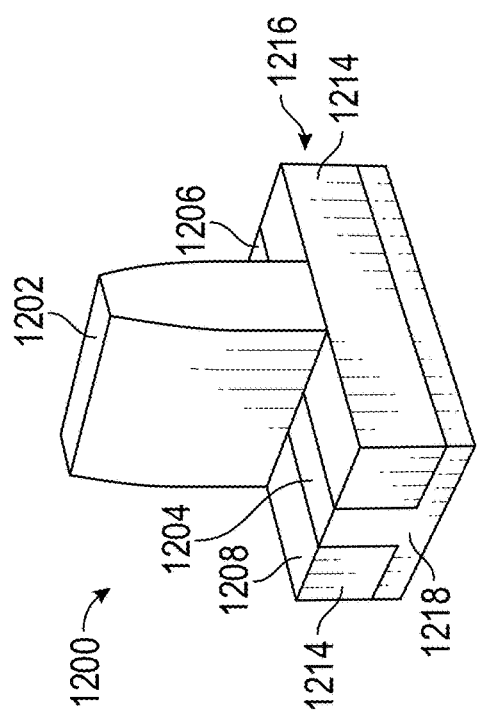

FIG. 12A is a perspective view of an example planar transistor 1200 comprising a gate 1202 that controls current flow between a source region 1204 and a drain region 1206. The transistor 1200 is planar in that the source region 1204 and the drain region 1206 are planar with respect to the substrate surface 1208.

FIG. 12B is a perspective view of an example FinFET transistor 1220 comprising a gate 1222 that controls current flow between a source region 1224 and a drain region 1226. The transistor 1220 is non-planar in that the source region 1224 and the drain region 1226 comprise "fins" that extend upwards from the substrate surface 1208. As the gate 1222 encompasses three sides of the semiconductor fin that extends from the source region 1224 to the drain region 1226, the transistor 1220 can be considered a tri-gate transistor. FIG. 12B illustrates only one S/D fin extending through the gate 1222, but multiple S/D fins can extend through the gate of a FinFET transistor.

Figure 12C:
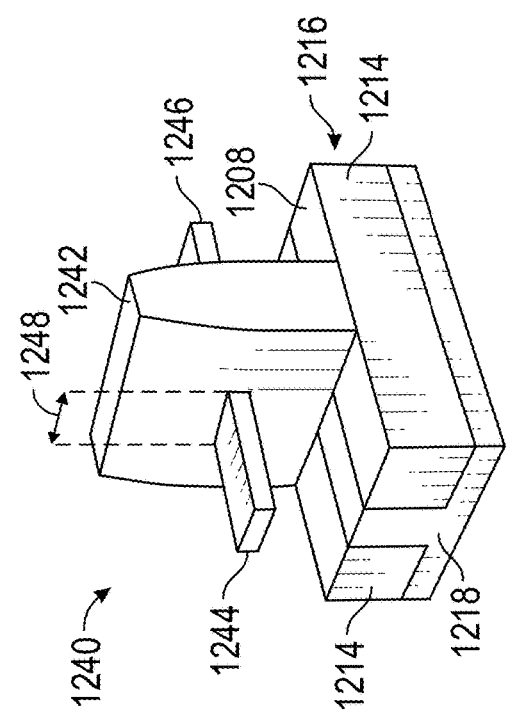

FIG. 12C is a perspective view of a gate-all-around (GAA) transistor 1240 comprising a gate 1242 that controls current flow between a source region 1244 and a drain region 1246. The transistor 1240 is non-planar in that the source region 1244 and the drain region 1246 are elevated from the substrate surface 1208.

FIG. 12D is a perspective view of a GAA transistor 1260 comprising a gate 1262 that controls current flow between multiple elevated source regions 1264 and multiple elevated drain regions 1266. The transistor 1260 is a stacked GAA transistor as the gate controls the flow of current between multiple elevated S/D regions stacked on top of each other. The transistors 1240 and 1260 are considered gate-all-around transistors as the gates encompass all sides of the semiconductor portions that extends from the source regions to the drain regions. The transistors 1240 and 1260 can alternatively be referred to as nanowire, nanosheet, or nanoribbon transistors depending on the width (e.g., widths 1248 and 1268 of transistors 1240 and 1260, respectively) of the semiconductor portions extending through the gate.

Returning to FIG. 11, a transistor 1140 may include a gate 1122 formed of at least two layers, a gate dielectric and a gate electrode (or conductive trace). The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1140 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1140 along the source-channel-drain direction, the gate electrode may consist of a U-shaped structure that includes a bottom portion substantially parallel to the surface of the die substrate 1102 and two sidewall portions that are substantially perpendicular to the top surface of the die substrate 1102. In other embodiments, at least one of the metal layers that form the gate electrode may simply be a planar layer that is substantially parallel to the top surface of the die substrate 1102 and does not include sidewall portions substantially perpendicular to the top surface of the die substrate 1102. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1120 may be formed within the die substrate 1102 adjacent to the gate 1122 of individual transistors 1140. The S/D regions 1120 may be formed using an implantation/diffusion process or an etching/deposition process, for example. In the former process, dopants such as boron, aluminum, antimony, phosphorous, or arsenic may be ion-implanted into the die substrate 1102 to form the S/D regions 1120. An annealing process that activates the dopants and causes them to diffuse farther into the die substrate 1102 may follow the ion-implantation process. In the latter process, the die substrate 1102 may first be etched to form recesses at the locations of the S/D regions 1120. An epitaxial deposition process may then be carried out to fill the recesses with material that is used to fabricate the S/D regions 1120. In some implementations, the S/D regions 1120 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1120 may be formed using one or more alternate semiconductor materials such as germanium or a group III-V material or alloy. In further embodiments, one or more layers of metal and/or metal alloys may be used to form the S/D regions 1120.

Electrical signals, such as power and/or input/output (I/O) signals, may be routed to and/or from the devices (e.g., transistors 1140) of the device layer 1104 through one or more interconnect layers disposed on the device layer 1104 (illustrated in FIG. 11 as interconnect layers 1106-1110). For example, electrically conductive features of the device layer 1104 (e.g., the gate 1122 and the S/D contacts 1124) may be electrically coupled with the interconnect structures 1128 of the interconnect layers 1106-1110. The one or more interconnect layers 1106-1110 may form a metallization stack (also referred to as an "ILD stack") 1119 of the integrated circuit device 1100.

The interconnect structures 1128 may be arranged within the interconnect layers 1106-1110 to route electrical signals according to a wide variety of designs; in particular, the arrangement is not limited to the particular configuration of interconnect structures 1128 depicted in FIG. 11. Although a particular number of interconnect layers 1106-1110 is depicted in FIG. 11, embodiments of the present disclosure include integrated circuit devices having more or fewer interconnect layers than depicted.

In some embodiments, the interconnect structures 1128 may include lines 1128a and/or vias 1128b filled with an electrically conductive material such as a metal. The lines 1128a may be arranged to route electrical signals in a direction of a plane that is substantially parallel with a surface of the die substrate 1102 upon which the device layer 1104 is formed. For example, the lines 1128a may route electrical signals in a direction in and out of the page and/or in a direction across the page from the perspective of FIG. 4. The vias 1128b may be arranged to route electrical signals in a direction of a plane that is substantially perpendicular to the surface of the die substrate 1102 upon which the device layer 1104 is formed. In some embodiments, the vias 1128b may electrically couple lines 1128a of different interconnect layers 1106-1110 together.

The interconnect layers 1106-1110 may include a dielectric material 1126 disposed between the interconnect structures 1128, as shown in FIG. 11. The dielectric material 1126 disposed between the interconnect structures can be referred to as an inter-layer dielectric (ILD). In some embodiments, dielectric material 1126 disposed between the interconnect structures 1128 in different ones of the interconnect layers 1106-1110 may have different compositions; in other embodiments, the composition of the dielectric material 1126 between different interconnect layers 1106-1110 may be the same. In some embodiments, dielectric 1126 the interconnect structures 1128 can comprise a perovskite material. The device layer 1104 may include a dielectric material 1126 disposed between the transistors 1140 and a bottom layer of the metallization stack as well. The dielectric material 1126 included in the device layer 1104 may have a different composition than the dielectric material 1126 included in the interconnect layers 1106-1110; in other embodiments, the composition of the dielectric material 1126 in the device layer 1104 may be the same as a dielectric material 1126 included in any one of the interconnect layers 1106-1110. The one or more interconnect layers 1106-1110 plus the dielectric layers between the interconnect layers 706-710 may form a metallization stack (also referred to as an "ILD stack" (inter-layer dielectric stack)) 1119 of the integrated circuit device 1100.

A first interconnect layer 1106 (referred to as Metal 1 or "M1") may be formed directly on the device layer 1104. In some embodiments, the first interconnect layer 1106 may include lines 1128*a* and/or vias 1128*b*, as shown. The lines 1128*a* of the first interconnect layer 1106 may be coupled with contacts (e.g., the S/D contacts 1124) of the device layer 1104. The vias 1128*b* of the first interconnect layer 1106 may be coupled with the lines 1128*a* of a second interconnect layer 1108.

The second interconnect layer 1108 (referred to as Metal 2 or "M2") may be formed directly on the first interconnect layer 1106. In some embodiments, the second interconnect layer 1108 may include via 1128*b* to couple the lines 1128 of the second interconnect layer 1108 with the lines 1128*a* of a third interconnect layer 1110. Although the lines 1128*a* and the vias 1128*b* are structurally delineated with a line within individual interconnect layers for the sake of clarity, the lines 1128*a* and the vias 1128*b* may be structurally and/or materially contiguous (e.g., simultaneously filled during a dual-damascene process) in some embodiments.

The third interconnect layer 1110 (referred to as Metal 3 or "M3") (and additional interconnect layers, as desired) may be formed in succession on the second interconnect layer 1108 according to similar techniques and configurations described in connection with the second interconnect layer 1108 or the first interconnect layer 1106. In some embodiments, the interconnect layers that are "higher up" in the metallization stack 1119 in the integrated circuit device 1100 (i.e., farther away from the device layer 1104) may be thicker that the interconnect layers that are lower in the metallization stack 1119, with lines 1128*a* and vias 1128*b* in the higher interconnect layers being thicker than those in the lower interconnect layers.

In some embodiments, MESO devices can be fabricated within the ILD stack. That is, a MESO device can be fabricated between adjacent interconnect layers (e.g., between Metal 2 and Metal 3 layers) or non-adjacent interconnect layers. A via can be used to connect a MESO device electrode to an interconnect. In some embodiments, a MESO device electrode can connect to an interconnect layer by being positioned adjacent to an interconnect layer.

The integrated circuit device 1100 may include a solder resist material 1134 (e.g., polyimide or similar material) and one or more conductive contacts 1136 formed on the interconnect layers 1106-1110. In FIG. 11, the conductive contacts 1136 are illustrated as taking the form of bond pads. The conductive contacts 1136 may be electrically coupled with the interconnect structures 1128 and configured to route the electrical signals of the transistor(s) 1140 to external devices. For example, solder bonds may be formed on the one or more conductive contacts 1136 to mechanically and/or electrically couple an integrated circuit die including the integrated circuit device 1100 with another component (e.g., a printed circuit board). The integrated circuit device 1100 may include additional or alternate structures to route the electrical signals from the interconnect layers 1106-1110; for example, the conductive contacts 1136 may include other analogous features (e.g., posts) that route the electrical signals to external components.

In some embodiments in which the integrated circuit device 1100 is a double-sided die, the integrated circuit device 1100 may include another metallization stack (not shown) on the opposite side of the device layer(s) 1104. This metallization stack may include multiple interconnect layers as discussed above with reference to the interconnect layers 1106-1110, to provide conductive pathways (e.g., including conductive lines and vias) between the device layer(s) 1104 and additional conductive contacts (not shown) on the opposite side of the integrated circuit device 1100 from the conductive contacts 1136.

In other embodiments in which the integrated circuit device 1100 is a double-sided die, the integrated circuit device 1100 may include one or more through silicon vias (TSVs) through the die substrate 1102; these TSVs may make contact with the device layer(s) 1104, and may provide conductive pathways between the device layer(s) 1104 and additional conductive contacts (not shown) on the opposite side of the integrated circuit device 1100 from the conductive contacts 1136. In some embodiments, TSVs extending through the substrate can be used for routing power and ground signals from conductive contacts on the opposite side of the integrated circuit device 1100 from the conductive contacts 1136 to the transistors 1140 and any other components integrated into the die 1100, and the metallization stack 1119 can be used to route I/O signals from the conductive contacts 1136 to transistors 1140 and any other components integrated into the die 1100.

Multiple integrated circuit devices 1100 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 13:
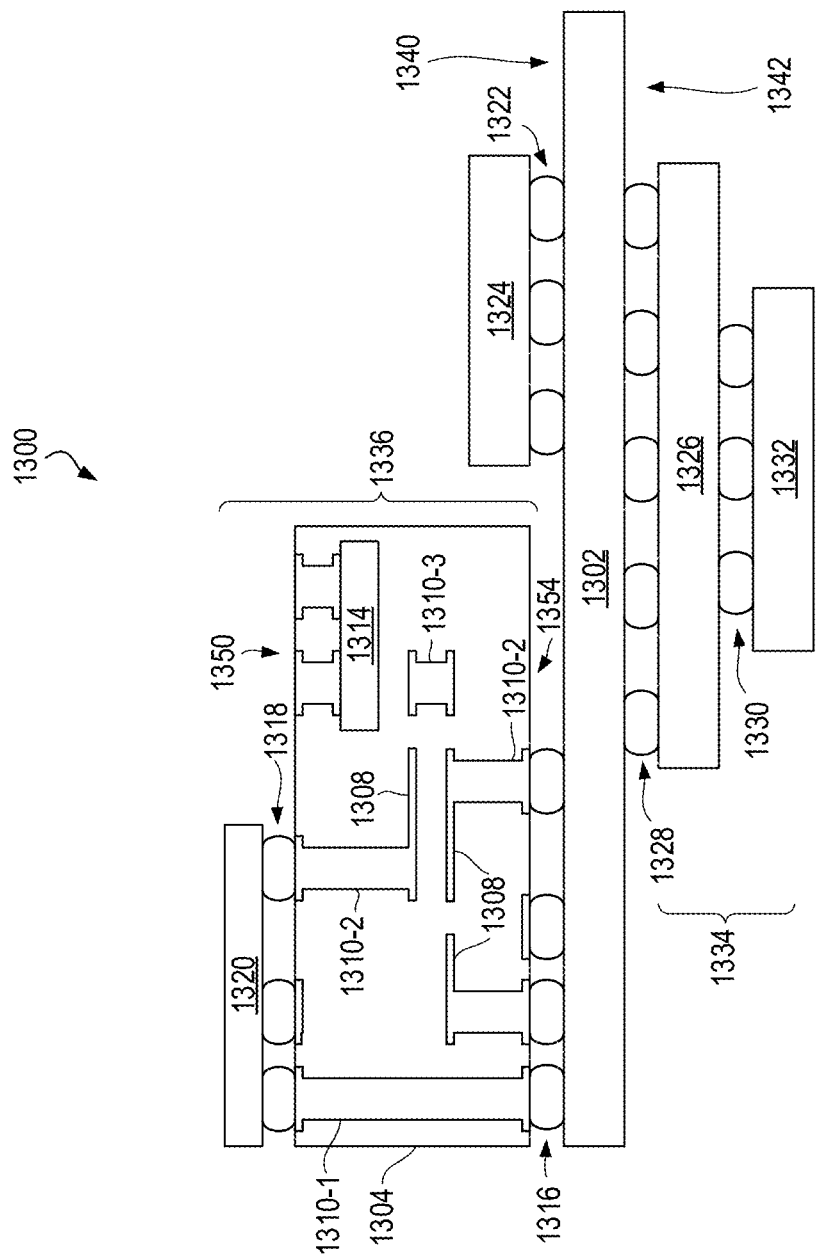
FIG. 13 is a cross-sectional side view of an integrated circuit device assembly that may include a microelectronic assembly, in accordance with any of the embodiments disclosed herein.

FIG. 13 is a cross-sectional side view of an integrated circuit device assembly 1300 that may include a processor unit, integrated circuit component, or other components comprising MESO devices. The integrated circuit device assembly 1300 includes a number of components disposed on a circuit board 1302 (which may be a motherboard, system board, mainboard, etc.). The integrated circuit device assembly 1300 includes components disposed on a first face 1340 of the circuit board 1302 and an opposing second face 1342 of the circuit board 1302; generally, components may be disposed on one or both faces 1340 and 1342.

In some embodiments, the circuit board 1302 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 1302. In other embodiments, the circuit board 1302 may be a non-PCB substrate. The integrated circuit device assembly 1300 illustrated in FIG. 13 includes a package-on-interposer structure 1336 coupled to the first face 1340 of the circuit board 1302 by coupling components 1316. The coupling components 1316 may electrically and mechanically couple the package-on-interposer structure 1336 to the circuit board 1302, and may include solder balls (as shown in FIG. 13), pins (e.g., as part of a pin grid array (PGA), contacts (e.g., as part of a land grid array (LGA)), male and female portions of a socket, an adhesive, an underfill material, and/or any other suitable electrical and/or mechanical coupling structure.

The package-on-interposer structure 1336 may include an integrated circuit component 1320 coupled to an interposer 1304 by coupling components 1318. The coupling components 1318 may take any suitable form for the application, such as the forms discussed above with reference to the coupling components 1316. Although a single integrated circuit component 1320 is shown in FIG. 13, multiple integrated circuit components may be coupled to the interposer 1304; indeed, additional interposers may be coupled to the interposer 1304. The interposer 1304 may provide an intervening substrate used to bridge the circuit board 1302 and the integrated circuit component 1320.

The integrated circuit component 1320 may be a packaged or unpacked integrated circuit product that includes one or more integrated circuit dies (e.g., the die 1002 of FIG. 10, the integrated circuit device 1100 of FIG. 11) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 1320, a single monolithic integrated circuit die comprises solder bumps attached to contacts on the die. The solder bumps allow the die to be directly attached to the interposer 1304. The integrated circuit component 1320 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 1320 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 1320 comprises multiple integrated circuit dies, the dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 1320 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 1304 may spread connections to a wider pitch or reroute a connection to a different connection. For example, the interposer 1304 may couple the integrated circuit component 1320 to a set of ball grid array (BGA) conductive contacts of the coupling components 1316 for coupling to the circuit board 1302. In the embodiment illustrated in FIG. 13, the integrated circuit component 1320 and the circuit board 1302 are attached to opposing sides of the interposer 1304; in other embodiments, the integrated circuit component 1320 and the circuit board 1302 may be attached to a same side of the interposer 1304. In some embodiments, three or more components may be interconnected by way of the interposer 1304.

In some embodiments, the interposer 1304 may be formed as a PCB, including multiple metal layers separated from one another by layers of dielectric material and interconnected by electrically conductive vias. In some embodiments, the interposer 1304 may be formed of an epoxy resin, a fiberglass-reinforced epoxy resin, an epoxy resin with inorganic fillers, a ceramic material, or a polymer material such as polyimide. In some embodiments, the interposer 1304 may be formed of alternate rigid or flexible materials that may include the same materials described above for use in a semiconductor substrate, such as silicon, germanium, and other group III-V and group IV materials. The interposer 1304 may include metal interconnects 1308 and vias 1310, including but not limited to through hole vias 1310-1 (that extend from a first face 1350 of the interposer 1304 to a second face 1354 of the interposer 1304), blind vias 1310-2 (that extend from the first or second faces 1350 or 1354 of the interposer 1304 to an internal metal layer), and buried vias 1310-3 (that connect internal metal layers).

In some embodiments, the interposer 1304 can comprise a silicon interposer. Through silicon vias (TSV) extending through the silicon interposer can connect connections on a first face of a silicon interposer to an opposing second face of the silicon interposer. In some embodiments, an interposer 1304 comprising a silicon interposer can further comprise one or more routing layers to route connections on a first face of the interposer 1304 to an opposing second face of the interposer 1304.

The interposer 1304 may further include embedded devices 1314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1304. The package-on-interposer structure 1336 may take the form of any of the package-on-interposer structures known in the art. In embodiments where the interposer is a non-printed circuit board The integrated circuit device assembly 1300 may include an integrated circuit component 1324 coupled to the first face 1340 of the circuit board 1302 by coupling components 1322. The coupling components 1322 may take the form of any of the embodiments discussed above with reference to the coupling components 1316, and the integrated circuit component 1324 may take the form of any of the embodiments discussed above with reference to the integrated circuit component 1320.

The integrated circuit device assembly 1300 illustrated in FIG. 13 includes a package-on-package structure 1334 coupled to the second face 1342 of the circuit board 1302 by coupling components 1328. The package-on-package structure 1334 may include an integrated circuit component 1326 and an integrated circuit component 1332 coupled together by coupling components 1330 such that the integrated circuit component 1326 is disposed between the circuit board 1302 and the integrated circuit component 1332. The coupling components 1328 and 1330 may take the form of any of the embodiments of the coupling components 1316 discussed above, and the integrated circuit components 1326 and 1332 may take the form of any of the embodiments of the integrated circuit component 1320 discussed above. The package-on-package structure 1334 may be configured in accordance with any of the package-on-package structures known in the art.

Figure 14:
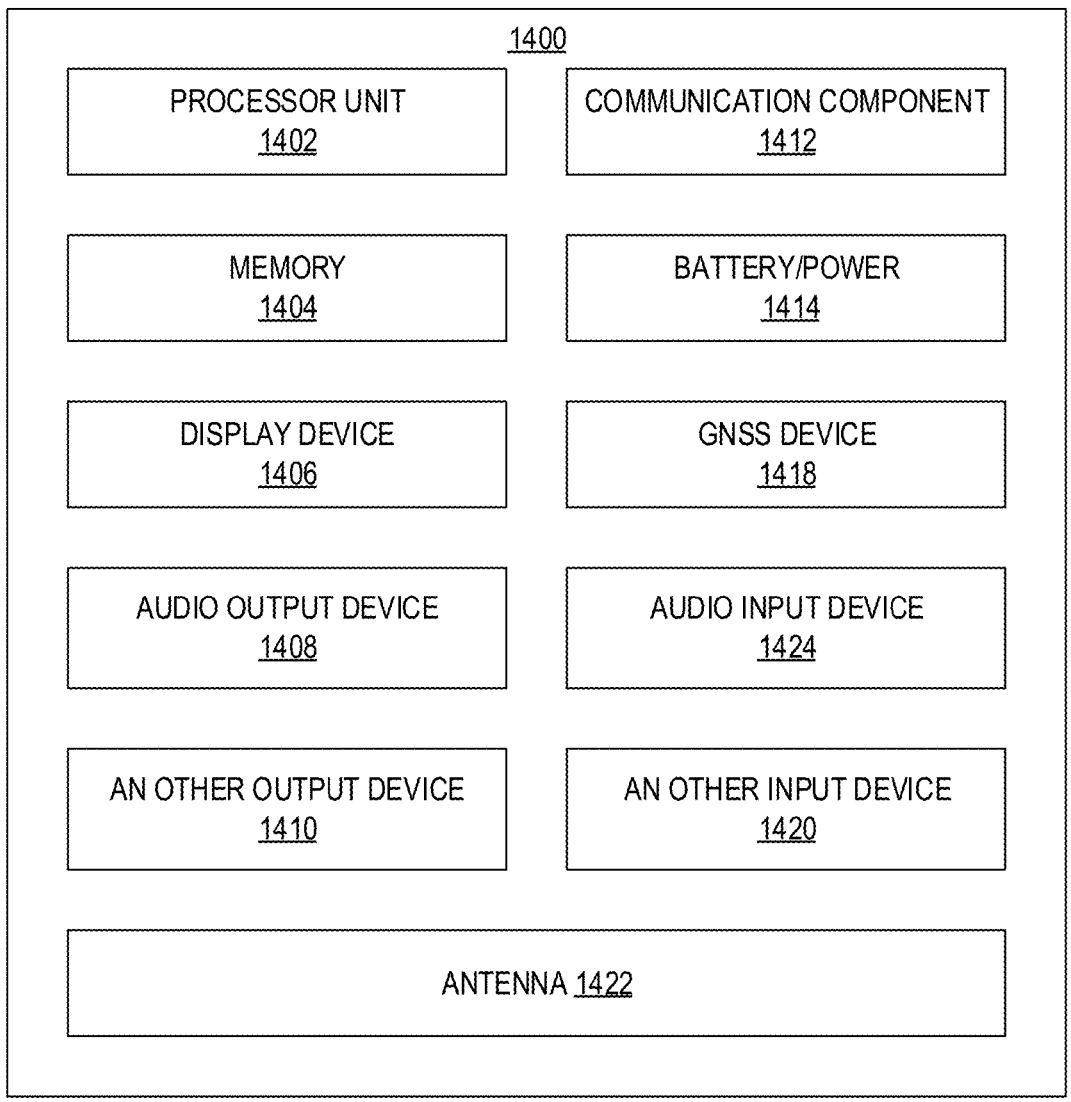
FIG. 14 is a block diagram of an example electrical device that may include a microelectronic assembly, in accordance with any of the embodiments disclosed herein.

FIG. 14 is a block diagram of an example electrical device 1400 that may include one or more of the MESO devices disclosed herein. Any suitable ones of the components of the electrical device 1400 may include one or more of the integrated circuit device assemblies 1300, integrated circuit components 1320, integrated circuit devices 1100, or integrated circuit dies 1002 disclosed herein. A number of components are illustrated in FIG. 14 as included in the electrical device 1400, but any one or more of these components may be omitted or duplicated, as suitable for the application. In some embodiments, some or all of the components included in the electrical device 1400 may be attached to one or more motherboards, mainboards, system boards, or other printed circuit boards. In some embodiments, one or more of these components are fabricated onto a single system-on-a-chip (SoC) die.

Additionally, in various embodiments, the electrical device 1400 may not include one or more of the components illustrated in FIG. 14, but the electrical device 1400 may include interface circuitry for coupling to the one or more components. For example, the electrical device 1400 may not include a display device 1406, but may include display device interface circuitry (e.g., a connector and driver circuitry) to which a display device 1406 may be coupled. In another set of examples, the electrical device 1400 may not include an audio input device 1424 or an audio output device 1408, but may include audio input or output device interface circuitry (e.g., connectors and supporting circuitry) to which an audio input device 1424 or audio output device 1408 may be coupled.

The electrical device 1400 may include one or more processor units 1402 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 1402 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 1400 may include a memory 1404, which may itself include one or more memory devices such as volatile memory (e.g., dynamic random access memory (DRAM), static random-access memory (SRAM)), nonvolatile memory (e.g., read-only memory (ROM), flash memory, chalcogenide-based phase-change non-voltage memories), solid state memory, and/or a hard drive. In some embodiments, the memory 1404 may include memory that is located on the same integrated circuit die as the processor unit 1402. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 1400 can comprise one or more processor units 1402 that are heterogeneous or asymmetric to another processor unit 1402 in the electrical device 1400. There can be a variety of differences between the processing units 1402 in a system in terms of a spectrum of metrics of merit including architectural, microarchitectural, thermal, power consumption characteristics, and the like. These differences can effectively manifest themselves as asymmetry and heterogeneity among the processor units 1402 in the electrical device 1400.

In some embodiments, the electrical device 1400 may include a communication component 1412 (e.g., one or more communication components). For example, the communication component 1412 can manage wireless communications for the transfer of data to and from the electrical device 1400. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 1412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 1412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 1412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 1412 may operate in accordance with Code Division Multiple Access (CDMA), Time Division Multiple Access (TDMA), Digital Enhanced Cordless Telecommunications (DECT), Evolution-Data Optimized (E-VDO), and derivatives thereof, as well as any other wireless protocols that are designated as 3G, 4G, 5G, and beyond. The communication component 1412 may operate in accordance with other wireless protocols in other embodiments. The electrical device 1400 may include an antenna 1422 to facilitate wireless communications and/or to receive other wireless communications (such as AM or FM radio transmissions).

In some embodiments, the communication component 1412 may manage wired communications, such as electrical, optical, or any other suitable communication protocols (e.g., IEEE 802.3 Ethernet standards). As noted above, the communication component 1412 may include multiple communication components. For instance, a first communication component 1412 may be dedicated to shorter-range wireless communications such as Wi-Fi or Bluetooth, and a second communication component 1412 may be dedicated to longer-range wireless communications such as global positioning system (GPS), EDGE, GPRS, CDMA, WiMAX, LTE, E-VDO, or others. In some embodiments, a first communication component 1412 may be dedicated to wireless communications, and a second communication component 1412 may be dedicated to wired communications.

The electrical device 1400 may include battery/power circuitry 1414. The battery/power circuitry 1414 may include one or more energy storage devices (e.g., batteries or capacitors) and/or circuitry for coupling components of the electrical device 1400 to an energy source separate from the electrical device 1400 (e.g., AC line power).

The electrical device 1400 may include a display device 1406 (or corresponding interface circuitry, as discussed above). The display device 1406 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 1400 may include an audio output device 1408 (or corresponding interface circuitry, as discussed above). The audio output device 1408 may include any embedded or wired or wirelessly connected external device that generates an audible indicator, such speakers, headsets, or earbuds.

The electrical device 1400 may include an audio input device 1424 (or corresponding interface circuitry, as discussed above). The audio input device 1424 may include any embedded or wired or wirelessly connected device that generates a signal representative of a sound, such as microphones, microphone arrays, or digital instruments (e.g., instruments having a musical instrument digital interface (MIDI) output). The electrical device 1400 may include a Global Navigation Satellite System (GNSS) device 1418 (or corresponding interface circuitry, as discussed above), such as a Global Positioning System (GPS) device. The GNSS device 1418 may be in communication with a satellite-based system and may determine a geolocation of the electrical device 1400 based on information received from one or more GNSS satellites, as known in the art.

The electrical device 1400 may include an other output device 1410 (or corresponding interface circuitry, as discussed above). Examples of the other output device 1410 may include an audio codec, a video codec, a printer, a wired or wireless transmitter for providing information to other devices, or an additional storage device.

The electrical device 1400 may include an other input device 1420 (or corresponding interface circuitry, as discussed above). Examples of the other input device 1420 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 1400 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 1400 may be any other electronic device that processes data. In some embodiments, the electrical device 1400 may comprise multiple discrete physical components. Given the range of devices that the electrical device 1400 can be manifested as in various embodiments, in some embodiments, the electrical device 1400 can be referred to as a computing device or a computing system. Further, the terms "computing device" and "computing system" as used herein are used interchangeably, and the term "apparatus" can refer to an electrical device, a computing device, or a computing system.

As used in this application and the claims, a list of items joined by the term "and/or" can mean any combination of the listed items. For example, the phrase "A, B and/or C" can mean A; B; C; A and B; A and C; B and C; or A, B and C. As used in this application and the claims, a list of items joined by the term "at least one of" can mean any combination of the listed terms. For example, the phrase "at least one of A, B or C" can mean A; B; C; A and B; A and C; B and C; or A, B, and C. Moreover, as used in this application and the claims, a list of items joined by the term "one or more of" can mean any combination of the listed terms. For example, the phrase "one or more of A, B and C" can mean A; B; C; A and B; A and C; B and C; or A, B, and C.

The disclosed methods, apparatuses, and systems are not to be construed as limiting in any way. Instead, the present disclosure is directed toward all novel and nonobvious features and aspects of the various disclosed embodiments, alone and in various combinations and subcombinations with one another. The disclosed methods, apparatuses, and systems are not limited to any specific aspect or feature or combination thereof, nor do the disclosed embodiments require that any one or more specific advantages be present or problems be solved.

Theories of operation, scientific principles, or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

The following examples pertain to additional embodiments of technologies disclosed herein.

Example 1 is an apparatus comprising: a first conductive trace; a ferromagnet; a magnetoelectric layer positioned between the first conductive trace and the ferromagnet; a second conductive trace positioned adjacent to the ferromagnet; a third conductive trace; and a multi-layer structure positioned between the ferromagnet and the third conductive trace, the multi-layer structure comprising a plurality of layers; wherein one or more of the first conductive trace, the second conductive trace, the third conductive trace, the ferromagnet, the magnetoelectric layer, and individual of the plurality of layers of the multi-layer structure comprise a perovskite material.

Example 2 comprises the apparatus of Example 1, wherein the first conductive trace, the second conductive trace, the third conductive trace, the ferromagnet, the magnetoelectric layer, and individual of the plurality of layers of the multi-layer structure comprise a perovskite material.

Example 3 comprises the apparatus of Example 1, wherein the ferromagnet comprises: a first ferromagnet positioned adjacent to the magnetoelectric layer; a second ferromagnet positioned adjacent to the multi-layer structure; and an inter-magnet insulating layer positioned between the first ferromagnet and the second ferromagnet.

Example 4 comprises the apparatus of Example 3, wherein one or more of the first ferromagnet, the second ferromagnet, and the inter-magnet insulating layer comprise a perovskite material.

Example 5 comprises the apparatus of Example 3, wherein the first conductive trace, the second conductive trace, the third conductive trace, the magnetoelectric layer, the first ferromagnet, the inter-magnet insulating layer, the second ferromagnet, and individual layers of the plurality of layers comprise a perovskite material.

Example 6 comprises the apparatus of Example 3, the apparatus further comprising a fourth conductive trace positioned adjacent to the second ferromagnet.

Example 7 comprises the apparatus of Example 3, wherein the inter-magnet insulating layer comprises: nickel, cobalt, titanium, and oxygen; strontium, titanium, cobalt, and oxygen; lanthanum, manganese, nickel, and oxygen; and lanthanum, copper, iridium, and oxygen.

Example 8 comprises the apparatus of Example 3, wherein the inter-magnet insulating layer comprises: tungsten and oxygen; sodium, tantalum, and oxygen; or strontium, titanium, and oxygen.

Example 9 comprises the apparatus of Example 3, wherein the inter-magnet insulating layer comprises: barium, titanium and oxygen; potassium, tantalum, and oxygen; or lithium, niobium, and oxygen.

Example 10 comprises the apparatus of any one of Examples 1-9, wherein the magnetoelectric layer comprises: bismuth, iron, and oxygen; or lanthanum, bismuth, iron, and oxygen.

Example 10.1 comprises the apparatus of any one of Examples 1-9, wherein the magnetoelectric layer is a multi-layer magnetoelectric structure.

Example 10.2 comprises the apparatus of Example 10.1, wherein the multi-layer magnetoelectric structure comprises a first magnetoelectric layer comprising lutetium, iron, and oxygen and a second magnetoelectric layer comprising lutetium, iron and oxygen.

Example 10.3 comprises the apparatus of Example 10.1, wherein the multi-layer magnetoelectric structure comprises a first magnetoelectric layer comprising lutetium, iron, and oxygen and a second magnetoelectric layer comprising cobalt, iron and oxygen.

Example 11 comprises the apparatus of any one of Examples 1-10, wherein one or more of the first conductive trace, the second conductive trace, and the third conductive trace comprises: niobium, strontium, titanium, and oxygen; lanthanum, strontium, manganese, and oxygen; or strontium, ruthenium, and oxygen.

Example 12 comprises the apparatus of any one of Examples 1-11, wherein the ferromagnet comprises: lanthanum, strontium, manganese, and oxygen; or lanthanum, strontium, iron, molybdenum, and oxygen.

Example 13 comprises the apparatus of any one of Examples 1-12, wherein the multi-layer structure comprises: a first layer positioned adjacent to the ferromagnet; a second layer positioned adjacent to the first layer; and a third layer positioned between and adjacent to the second layer and the third conductive trace, wherein the first layer, the second layer, and the third layer comprise perovskite materials.

Example 14 comprises the apparatus of Example 13, wherein: the first layer comprises: tungsten and oxygen; sodium, tantalum, and oxygen; strontium, titanium, and oxygen; barium, titanium, and oxygen; potassium, tantalum, and oxygen; or lithium, niobate, and oxygen; the second layer comprises: strontium, iridium, and oxygen; barium, iridium, and oxygen; or strontium, iridium, and oxygen; and the third layer comprises: strontium, ruthenium, and oxygen; strontium, titanium, and oxygen; or calcium, manganese, and oxygen.

Example 15 comprises the apparatus of Example 13, wherein: the first layer comprises: strontium, ruthenium, and oxygen; strontium, titanium, and oxygen; or calcium, manganese, and oxygen; the second layer comprises: strontium, iridium, and oxygen; barium, iridium, and oxygen; or strontium, iridium, and oxygen; and the third layer comprises: strontium, ruthenium, and oxygen; strontium, titanium, and oxygen; or calcium, manganese, and oxygen.

Example 16 comprises the apparatus of any one of Examples 1-12, wherein the multi-layer structure comprises: a first layer positioned adjacent to the ferromagnet; a second layer positioned adjacent to the first layer; a third layer positioned adjacent to the second layer; and a fourth layer positioned between and adjacent to the third layer and the third conductive trace, wherein the first layer, the second layer, the third layer, and the fourth layer comprise perovskite materials.

Example 17 comprises the apparatus of Example 16, wherein: the first layer comprises: tungsten and oxygen; sodium, tantalum, and oxygen; strontium, titanium, and oxygen; barium, titanium, and oxygen; potassium, tantalum, and oxygen; or lithium, niobate, and oxygen; the second layer comprises: strontium, ruthenium, and oxygen; strontium, titanium, and oxygen; or calcium, manganese, and oxygen; the third layer comprises: strontium, iridium, and oxygen; barium, iridium, and oxygen; or strontium, iridium, and oxygen; and the fourth layer comprises: strontium, ruthenium, and oxygen; strontium, titanium, and oxygen; or calcium, manganese, and oxygen.

Example 18 comprises the apparatus of Example 16, wherein: the first layer comprises: tungsten and oxygen; sodium, tantalum, and oxygen; strontium, titanium, and oxygen; barium, titanium, and oxygen; potassium, tantalum, and oxygen; or lithium, niobate, and oxygen; the second layer comprises lanthanum, aluminum, and oxygen; the third layer comprises strontium, titanium, and oxygen; and the fourth layer comprises: strontium, ruthenium, and oxygen; strontium, titanium, and oxygen; or calcium, manganese, and oxygen.

Example 19 comprises the apparatus of Example 16, wherein: the first layer comprises: strontium, ruthenium, and oxygen; strontium, titanium, and oxygen; or calcium, manganese, and oxygen; the second layer comprises lanthanum, aluminum, and oxygen; the third layer comprises strontium, titanium, and oxygen; and the fourth layer comprises: strontium, ruthenium, and oxygen; strontium, titanium, and oxygen; or calcium, manganese, and oxygen.

Example 20 comprises the apparatus of any one of Examples 1-12, wherein the multi-layer structure comprises a first layer positioned adjacent to the ferromagnet; a second layer positioned adjacent to the first layer: a third layer positioned adjacent to the second layer; a fourth layer positioned adjacent to the third layer; and a fifth layer positioned between and adjacent to the fourth layer and the third conductive trace, wherein the first layer, the second layer, the third layer, the fourth layer, and the fifth layer comprise perovskite materials.

Example 21 comprises the apparatus of Example 20, wherein: the first layer comprises: tungsten and oxygen; sodium, tantalum, and oxygen; strontium, titanium, and oxygen; barium, titanium, and oxygen; potassium, tantalum, and oxygen; or lithium, niobate, and oxygen; the second layer comprises: strontium, ruthenium, and oxygen; strontium, titanium, and oxygen; or calcium, manganese, and oxygen; the third layer comprises lanthanum, aluminum, and oxygen; the fourth layer comprises strontium, titanium, and oxygen; and the fifth layer comprises: strontium, ruthenium, and oxygen; strontium, titanium, and oxygen; or calcium, manganese, and oxygen.

Example 22 comprises the apparatus of any one of Examples 1-21, further comprising an inter-layer dielectric positioned adjacent to one or more of the first conductive trace, the second conductive trace, the third conductive trace, the magnetoelectric layer, the ferromagnet, and individual layers of the plurality of layers of the multi-layer structure, the inter-layer dielectric comprising a perovskite material.

Example 23 comprises the apparatus of Example 22, wherein the inter-layer dielectric comprises lanthanum, aluminum, and oxygen.

Example 24 comprises the apparatus of any one of Examples 1-23, wherein the apparatus is a processor unit.

Example 25 comprises the apparatus of any one of Examples 1-23, wherein the apparatus is an integrated circuit component.

Example 26 comprises the apparatus of Example 24 or Example 25, wherein the apparatus further comprises one or more electronic transistors.

Example 27 comprises the apparatus of any one of Examples 1-23 wherein the apparatus comprises a printed circuit board and an integrated circuit component attached to the printed circuit board, the integrated circuit component comprising the first conductive trace, the second conductive trace, the third conductive trace, the magnetoelectric layer, the ferromagnet, and the multi-layer structure.

Example 28 comprises the apparatus of Example 27 wherein the apparatus further comprises one or more memories attached to the printed circuit board.

Example 29 comprises the apparatus of any one of Examples 1-23, wherein the apparatus is a computing device comprising a processor unit, the processor unit comprising the first conductive trace, the second conductive trace, the third conductive trace, the magnetoelectric layer, the ferromagnet, and the multi-layer structure.

Example 30 is a method, comprising: forming a first conductive trace on an integrated circuit structure; forming a magnetoelectric layer positioned adjacent to the first conductive trace; forming a ferromagnet positioned adjacent to the magnetoelectric layer; forming a multi-layer structure positioned adjacent to the ferromagnet, the multi-layer structure comprising a plurality of layers; forming a second conductive trace positioned adjacent to the ferromagnet; and forming a third conductive trace positioned adjacent to the multi-layer structure; wherein one or more of the first conductive trace, the second conductive trace, the third conductive trace, the magnetoelectric layer, the ferromagnet, and individual layers of the plurality of layers of the multi-layer structure comprise a perovskite material.

Example 31 comprises the method of Example 30, wherein the forming the ferromagnet comprises: forming a first ferromagnet positioned adjacent to the magnetoelectric layer; forming an inter-magnet insulating layer positioned adjacent to the first ferromagnet; and forming a second ferromagnet positioned adjacent to the inter-magnet insulating layer.

Example 32 comprises the method of Example 31, wherein one or more of the first ferromagnet, the second ferromagnet, and the inter-magnet insulating layer comprise a perovskite material.

Example 33 comprises the method of Example 31, wherein the inter-magnet insulating layer comprises: nickel, cobalt, titanium, and oxygen; strontium, titanium, cobalt, and oxygen; lanthanum, manganese, nickel, and oxygen; and lanthanum, copper, iridium, and oxygen.

Example 34 comprises the method of Example 31, wherein the inter-magnet insulating layer comprises: tungsten and oxygen; sodium, tantalum, and oxygen; or strontium, titanium, and oxygen.

Example 35 comprises the method of Example 31, wherein the inter-magnet insulating layer comprises: barium, titanium, and oxygen; potassium, tantalum, and oxygen; or lithium, niobium, and oxygen.

Example 36 comprises the method of any one of Examples 30-35, wherein the magnetoelectric layer comprises: bismuth, iron, and oxygen; or bismuth, iron, oxygen, and lanthanum.

Example 36.1 comprises the method of any one of Examples 30-35, wherein the magnetoelectric layer is a multi-layer magnetoelectric structure.

Example 36.2 comprises the method of Example 36.1, wherein the multi-layer magnetoelectric structure comprises a first magnetoelectric layer comprising lutetium, iron, and oxygen and a second magnetoelectric layer comprising lutetium, iron and oxygen.

Example 36.3 comprises the method of Example 36.1, wherein the multi-layer magnetoelectric structure comprises a first magnetoelectric layer comprising lutetium, iron, and oxygen and a second magnetoelectric layer comprising cobalt, iron and oxygen.

Example 37 comprises the method of any one of Examples 30-35, wherein one or more of the first conductive trace, the second conductive trace, and the third conductive trace comprises: niobium, strontium, titanium, and oxygen; lanthanum, strontium, manganese, and oxygen; or strontium, ruthenium, and oxygen.

Example 38 comprises the method of any one of Examples 30-37, wherein the ferromagnet comprises: lanthanum, strontium, manganese, and oxygen; or lanthanum, strontium, iron, molybdenum, and oxygen.

Example 39 comprises the method of any one of Examples 30-38, wherein the forming the multi-layer structure comprises: forming a first layer adjacent to the ferromagnet; forming a second layer adjacent to the first layer; and forming a third layer adjacent to the second layer.

Example 40 comprises the method of Example 39, wherein: the first layer comprises: tungsten and oxygen; sodium, tantalum, and oxygen; strontium, titanium, and oxygen; barium, titanium, and oxygen; potassium, tantalum, and oxygen; or lithium, niobate, and oxygen; the second layer comprises: strontium, iridium, and oxygen; barium, iridium, and oxygen; or strontium, iridium, and oxygen; and the third layer comprises: strontium, ruthenium, and oxygen; strontium, titanium, and oxygen; or calcium, manganese, and oxygen.

Example 41 comprises the method of Example 39, wherein: the first layer comprises: strontium, ruthenium, and oxygen; strontium, titanium, and oxygen; or calcium, manganese, and oxygen; the second layer comprises: strontium, iridium, and oxygen; barium, iridium, and oxygen; or strontium, iridium, and oxygen; and the third layer comprises: strontium, ruthenium, and oxygen; strontium, titanium, and oxygen; or calcium, manganese, and oxygen.

Example 42 comprises the method of any one of Examples 30-38, wherein the forming the multi-layer structure comprises: forming a first layer adjacent to the ferromagnet; forming a second layer adjacent to the first layer; forming a third layer adjacent to the second layer; and forming a fourth layer adjacent to the third layer.

Example 43 comprises the method of Example 42, wherein: the first layer comprises: tungsten and oxygen; sodium, tantalum, and oxygen; strontium, titanium, and oxygen; barium, titanium, and oxygen; potassium, tantalum, and oxygen; or lithium, niobate, and oxygen; the second layer comprises: strontium, ruthenium, and oxygen; strontium, titanium, and oxygen; or calcium, manganese, and oxygen; the third layer comprises: strontium, iridium, and oxygen; barium, iridium, and oxygen; or strontium, iridium, and oxygen; and the fourth layer comprises: strontium, ruthenium, and oxygen; strontium, titanium, and oxygen; or calcium, manganese, and oxygen.

Example 44 comprises the method of Example 42, wherein: the first layer comprises: tungsten and oxygen; sodium, tantalum, and oxygen; strontium, titanium, and oxygen; barium, titanium, and oxygen; potassium, tantalum, and oxygen; or lithium, niobate, and oxygen; the second layer comprises lanthanum, aluminum, and oxygen; the third layer comprises strontium, titanium, and oxygen; and the fourth layer comprises: strontium, ruthenium, and oxygen; strontium, titanium, and oxygen; or calcium, manganese, and oxygen.

Example 45 comprises the method of Example 42, wherein: the first layer comprises: strontium, ruthenium, and oxygen; strontium, titanium, and oxygen; or calcium, manganese, and oxygen; the second layer comprises lanthanum, aluminum, and oxygen; the third layer comprises strontium, titanium, and oxygen; and the fourth layer comprises: strontium, ruthenium, and oxygen; strontium, titanium, and oxygen; or calcium, manganese, and oxygen.

Example 46 comprises the method of any one of Examples 30-38, wherein the forming the multi-layer structure comprising: forming a first layer adjacent to the ferromagnet; forming a second layer adjacent to the first layer; forming a third layer adjacent to the second layer; forming a fourth layer adjacent to the third layer; and forming a fifth layer adjacent to the fourth layer.

Example 47 comprises the method of Example 46, wherein: the first layer comprises: tungsten and oxygen; sodium, tantalum, and oxygen; strontium, titanium, and oxygen; barium, titanium, and oxygen; potassium, tantalum, and oxygen; or lithium, niobate, and oxygen; the second layer comprises: strontium, ruthenium, and oxygen; strontium, titanium, and oxygen; or calcium, manganese, and oxygen; the third layer comprises lanthanum, aluminum, and oxygen; the fourth layer comprises strontium, titanium, and oxygen; and the fifth layer comprises: strontium, ruthenium, and oxygen; strontium, titanium, and oxygen; or calcium, manganese, and oxygen.

Example 48 comprises the method of any one of Examples 30-47, wherein the integrated circuit structure comprises a die substrate.

The invention claimed is:

1. An apparatus comprising:
   a first conductive trace;
   a ferromagnet;
   a magnetoelectric layer positioned between the first conductive trace and the ferromagnet;
   a second conductive trace positioned adjacent to the ferromagnet;
   a third conductive trace; and
   a multi-layer structure positioned between the ferromagnet and the third conductive trace, the multi-layer structure comprising a plurality of layers;
   wherein one or more of the first conductive trace, the second conductive trace, the third conductive trace, the ferromagnet, the magnetoelectric layer, and individual of the plurality of layers of the multi-layer structure comprise a perovskite material.

2. The apparatus of claim 1, wherein the first conductive trace, the second conductive trace, the third conductive trace, the ferromagnet, the magnetoelectric layer, and individual of the plurality of layers of the multi-layer structure comprise a perovskite material.

3. The apparatus of claim 1, wherein the ferromagnet comprises:
   a first ferromagnet positioned adjacent to the magnetoelectric layer;
   a second ferromagnet positioned adjacent to the multi-layer structure; and
   an inter-magnet insulating layer positioned between the first ferromagnet and the second ferromagnet.

4. The apparatus of claim 3, wherein the first conductive trace, the second conductive trace, the third conductive trace, the magnetoelectric layer, the first ferromagnet, the inter-magnet insulating layer, the second ferromagnet, and individual layers of the plurality of layers comprise a perovskite material.

5. The apparatus of claim 3, wherein the inter-magnet insulating layer comprises:
   nickel, cobalt, titanium, and oxygen;
   strontium, titanium, cobalt, and oxygen;
   lanthanum, manganese, nickel, and oxygen; and
   lanthanum, copper, iridium, and oxygen.

6. The apparatus of claim 3, wherein the inter-magnet insulating layer comprises:
   tungsten and oxygen;
   sodium, tantalum, and oxygen; or
   strontium, titanium, and oxygen.

7. The apparatus of claim 3, wherein the inter-magnet insulating layer comprises:
   barium, titanium and oxygen;
   potassium, tantalum, and oxygen; or
   lithium, niobium, and oxygen.

8. The apparatus of claim 1, wherein the magnetoelectric layer comprises:
   bismuth, iron, and oxygen; or
   lanthanum, bismuth, iron, and oxygen.

9. The apparatus of claim 1, wherein the magnetoelectric layer is a multi-layer magnetoelectric structure.

10. The apparatus of claim 1, wherein the multi-layer structure comprises:
    two or more magnetoelectric layers comprising lutetium, iron, and oxygen; or
    a first magnetoelectric layer comprising lutetium, iron, and oxygen; and
    a second magnetoelectric layer comprising cobalt, iron, and oxygen.

11. The apparatus of claim 1, wherein one or more of the first conductive trace, the second conductive trace, and the third conductive trace comprises:
    niobium, strontium, titanium, and oxygen;
    lanthanum, strontium, manganese, and oxygen; or
    strontium, ruthenium, and oxygen.

12. The apparatus of claim 1, wherein the ferromagnet comprises:
lanthanum, strontium, manganese, and oxygen; or
lanthanum, strontium, iron, molybdenum, and oxygen.

13. The apparatus of claim 1, wherein the multi-layer structure comprises:
a first layer positioned adjacent to the ferromagnet;
a second layer positioned adjacent to the first layer; and
a third layer positioned between and adjacent to the second layer and the third conductive trace, wherein the first layer, the second layer, and the third layer comprise perovskite materials.

14. The apparatus of claim 13, wherein:
the first layer comprises:
tungsten and oxygen;
sodium, tantalum, and oxygen;
strontium, titanium, and oxygen;
barium, titanium, and oxygen;
potassium, tantalum, and oxygen; or
lithium, niobate, and oxygen;
the second layer comprises:
strontium, iridium, and oxygen;
barium, iridium, and oxygen; or
strontium, iridium, and oxygen; and
the third layer comprises:
strontium, ruthenium, and oxygen;
strontium, titanium, and oxygen; or
calcium, manganese, and oxygen.

15. The apparatus of claim 13, wherein:
the first layer comprises:
strontium, ruthenium, and oxygen;
strontium, titanium, and oxygen; or
calcium, manganese, and oxygen;
the second layer comprises:
strontium, iridium, and oxygen;
barium, iridium, and oxygen; or
strontium, iridium, and oxygen; and
the third layer comprises:
strontium, ruthenium, and oxygen;
strontium, titanium, and oxygen; or
calcium, manganese, and oxygen.

16. The apparatus of claim 1, wherein the multi-layer structure comprises:
a first layer positioned adjacent to the ferromagnet;
a second layer positioned adjacent to the first layer;
a third layer positioned adjacent to the second layer; and
a fourth layer positioned between and adjacent to the third layer and the third conductive trace, wherein the first layer, the second layer, the third layer, and the fourth layer comprise perovskite materials.

17. The apparatus of claim 16, wherein:
the first layer comprises:
tungsten and oxygen;
sodium, tantalum, and oxygen;
strontium, titanium, and oxygen;
barium, titanium, and oxygen;
potassium, tantalum, and oxygen; or
lithium, niobate, and oxygen;
the second layer comprises:
strontium, ruthenium, and oxygen;
strontium, titanium, and oxygen; or
calcium, manganese, and oxygen;
the third layer comprises:
strontium, iridium, and oxygen;
barium, iridium, and oxygen; or
strontium, iridium, and oxygen; and
the fourth layer comprises:
strontium, ruthenium, and oxygen;
strontium, titanium, and oxygen; or
calcium, manganese, and oxygen.

18. The apparatus of claim 16, wherein:
the first layer comprises:
tungsten and oxygen;
sodium, tantalum, and oxygen;
strontium, titanium, and oxygen;
barium, titanium, and oxygen;
potassium, tantalum, and oxygen; or
lithium, niobate, and oxygen;
the second layer comprises lanthanum, aluminum, and oxygen;
the third layer comprises strontium, titanium, and oxygen; and
the fourth layer comprises:
strontium, ruthenium, and oxygen;
strontium, titanium, and oxygen; or
calcium, manganese, and oxygen.

19. The apparatus of claim 16, wherein:
the first layer comprises:
strontium, ruthenium, and oxygen;
strontium, titanium, and oxygen; or
calcium, manganese, and oxygen;
the second layer comprises lanthanum, aluminum, and oxygen;
the third layer comprises strontium, titanium, and oxygen; and
the fourth layer comprises:
strontium, ruthenium, and oxygen;
strontium, titanium, and oxygen; or
calcium, manganese, and oxygen.

20. The apparatus of claim 10, wherein the multi-layer structure comprises:
a first layer positioned adjacent to the ferromagnet;
a second layer positioned adjacent to the first layer:
a third layer positioned adjacent to the second layer;
a fourth layer positioned adjacent to the third layer; and
a fifth layer positioned between and adjacent to the fourth layer and the third conductive trace, wherein the first layer, the second layer, the third layer, the fourth layer, and the fifth layer comprise perovskite materials.

21. The apparatus of claim 20, wherein:
the first layer comprises:
tungsten and oxygen;
sodium, tantalum, and oxygen;
strontium, titanium, and oxygen;
barium, titanium, and oxygen;
potassium, tantalum, and oxygen; or
lithium, niobate, and oxygen;
the second layer comprises:
strontium, ruthenium, and oxygen;
strontium, titanium, and oxygen; or
calcium, manganese, and oxygen;
the third layer comprises lanthanum, aluminum, and oxygen;
the fourth layer comprises strontium, titanium, and oxygen; and
the fifth layer comprises:
strontium, ruthenium, and oxygen;
strontium, titanium, and oxygen; or
calcium, manganese, and oxygen.

22. The apparatus of claim 1, further comprising an inter-layer dielectric positioned adjacent to one or more of the first conductive trace, the second conductive trace, the third conductive trace, the magnetoelectric layer, the ferromagnet, and individual layers of the plurality of layers of the multi-layer structure, the inter-layer dielectric comprising a perovskite material.

23. The apparatus of claim 22, wherein the inter-layer dielectric comprises lanthanum, aluminum, and oxygen.

24. The apparatus of claim 1, wherein the apparatus is a processor unit.

25. The apparatus of claim 1, wherein the apparatus comprises:
   a printed circuit board;
   an integrated circuit component attached to the printed circuit board, the integrated circuit component comprising the first conductive trace, the second conductive trace, the third conductive trace, the magnetoelectric layer, the ferromagnet, and the multi-layer structure; and
   one or more memories attached to the printed circuit board.

\* \* \* \* \*